(12) United States Patent
Hatano

(10) Patent No.: US 9,847,379 B2
(45) Date of Patent: Dec. 19, 2017

(54) LIGHT-EMITTING DEVICE, ELECTRONIC APPLIANCE, AND LIGHTING DEVICE COMPRISING A LIGHT-EMITTING ELEMENT HAVING OPTIMIZED OPTICAL PATH LENGTH

(71) Applicant: Semiconductor Energy Laboratory Co., Ltd., Kanagawa-ken (JP)

(72) Inventor: Kaoru Hatano, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/061,062

(22) Filed: Mar. 4, 2016

(65) Prior Publication Data

US 2016/0190215 A1 Jun. 30, 2016

Related U.S. Application Data

(62) Division of application No. 13/439,329, filed on Apr. 4, 2012, now Pat. No. 9,287,332.

(30) Foreign Application Priority Data

Apr. 8, 2011 (JP) ................................. 2011-085922

(51) Int. Cl.
*H01L 31/113* (2006.01)
*H01L 35/24* (2006.01)
(Continued)

(52) U.S. Cl.
CPC ........ *H01L 27/3211* (2013.01); *H01L 51/504* (2013.01); *H01L 51/5218* (2013.01);
(Continued)

(58) Field of Classification Search
CPC ............. H01L 27/3211; H01L 51/5234; H01L 51/504; H01L 51/5218; H01L 2251/558; H01L 27/153; H01L 51/5203
See application file for complete search history.

(56) References Cited

U.S. PATENT DOCUMENTS 5,554,911 A 9/1996 Nakayama et al.
6,639,250 B1 10/2003 Shimoda et al.
(Continued)

FOREIGN PATENT DOCUMENTS

CN 001868240 A 11/2006
CN 001943057 A 4/2007
(Continued)

OTHER PUBLICATIONS

Kashiwabara, M. et al., "29.5L: Late-News Paper: Advanced AM-OLED Display Based on White Emitter With Microcavity Structure," SID Digest '04: SID International Symposium Digest of Technical Papers, 2004, vol. 35, pp. 1017-1019.
(Continued)

*Primary Examiner* — Benjamin Sandvik
*Assistant Examiner* — Damon Hillman
(74) *Attorney, Agent, or Firm* — Husch Blackwell LLP

(57) ABSTRACT

A light-emitting device and a lighting device each of which includes a plurality of light-emitting elements exhibiting light with different wavelengths are provided. The light-emitting device and the lighting device each have an element structure in which each of the light-emitting elements emits only light with a desired wavelength, and thus the light-emitting elements have favorable color purity. In the light-emitting element emitting light ($\lambda_R$) with the longest wavelength of the light with different wavelengths, the optical path length from a reflective electrode to a light-emitting layer (a light-emitting region) included in an EL layer is set
(Continued)

to $\lambda_R/4$ and the optical path length from the reflective electrode to a semi-transmissive and semi-reflective electrode is set to $\lambda_R/2$.

26 Claims, 8 Drawing Sheets

(51) Int. Cl.
H01L 27/32 (2006.01)
H01L 51/50 (2006.01)
H01L 51/52 (2006.01)

(52) U.S. Cl.
CPC ...... H01L 51/5234 (2013.01); H01L 51/5265 (2013.01); H01L 2251/558 (2013.01)

(56) References Cited

U.S. PATENT DOCUMENTS

| | | | |
|---|---|---|---|
| 6,680,570 | B2 | 1/2004 | Roitman et al. |
| 6,831,408 | B2 | 12/2004 | Hirano et al. |
| 6,847,163 | B1 | 1/2005 | Tsutsui et al. |
| 7,030,553 | B2 | 4/2006 | Winters et al. |
| 7,129,634 | B2 | 10/2006 | Boroson et al. |
| 7,158,161 | B2 | 1/2007 | Gyoutoku et al. |
| 7,192,659 | B2 | 3/2007 | Ricks et al. |
| 7,271,537 | B2 | 9/2007 | Matsuda et al. |
| 7,317,282 | B2 | 1/2008 | Tsutsui et al. |
| 7,462,883 | B2 | 12/2008 | Kumaki et al. |
| 7,548,019 | B2 | 6/2009 | Omura et al. |
| 7,554,265 | B2 | 6/2009 | Godo et al. |
| 7,564,052 | B2 | 7/2009 | Kumaki |
| 7,601,988 | B2 | 10/2009 | Seo et al. |
| 7,737,626 | B2 | 6/2010 | Kumaki et al. |
| 7,753,751 | B2 | 7/2010 | Yamazaki |
| 7,834,538 | B2 | 11/2010 | Yamazaki et al. |
| 7,851,989 | B2 | 12/2010 | Noda |
| 7,875,893 | B2 | 1/2011 | Seo et al. |
| 7,893,427 | B2 | 2/2011 | Kumaki et al. |
| 7,964,891 | B2 | 6/2011 | Kumaki et al. |
| 7,973,319 | B2 | 7/2011 | Kashiwabara et al. |
| 8,008,652 | B2 | 8/2011 | Kumaki et al. |
| 8,080,934 | B2 | 12/2011 | Kido et al. |
| 8,158,991 | B2 | 4/2012 | Nowatari et al. |
| 8,227,796 | B2 | 7/2012 | Asaki et al. |
| 8,269,227 | B2 | 9/2012 | Yamazaki et al. |
| 8,304,977 | B2 | 11/2012 | Oda |
| 8,373,342 | B2 | 2/2013 | Fukuda et al. |
| 8,415,686 | B2 | 4/2013 | Kashiwabara et al. |
| 8,513,678 | B2 | 8/2013 | Yamazaki |
| 8,779,453 | B2 | 7/2014 | Kurata et al. |
| 9,123,666 | B2 | 9/2015 | Kashiwabara et al. |
| 2003/0189401 | A1 | 10/2003 | Kido et al. |
| 2005/0098207 | A1 | 5/2005 | Matsumoto et al. |
| 2005/0218799 | A1 | 10/2005 | Hamada |
| 2006/0163597 | A1 | 7/2006 | Noda et al. |
| 2006/0267483 | A1 | 11/2006 | Tsutsui et al. |
| 2006/0284204 | A1 | 12/2006 | Yamazaki et al. |
| 2007/0001570 | A1 | 1/2007 | Nomura et al. |
| 2007/0102737 | A1* | 5/2007 | Kashiwabara ...... H01L 27/3211 257/291 |
| 2007/0176161 | A1 | 8/2007 | Seo et al. |
| 2007/0216289 | A1 | 9/2007 | Kuma et al. |
| 2008/0233669 | A1 | 9/2008 | Hirakata et al. |
| 2008/0241586 | A1 | 10/2008 | Kumaki et al. |
| 2009/0039777 | A1 | 2/2009 | Oda |
| 2009/0121239 | A1 | 5/2009 | Asaki et al. |
| 2009/0275161 | A1 | 11/2009 | Kumaki et al. |
| 2010/0176720 | A1 | 7/2010 | Yamazaki |
| 2011/0062475 | A1 | 3/2011 | Cho |
| 2011/0101345 | A1 | 5/2011 | Kumaki et al. |
| 2011/0101380 | A1 | 5/2011 | Kumaki et al. |
| 2011/0108864 | A1 | 5/2011 | Seo et al. |
| 2011/0114929 | A1 | 5/2011 | Fujita et al. |
| 2011/0140101 | A1 | 6/2011 | Noda |
| 2011/0187259 | A1 | 8/2011 | Fukuda et al. |
| 2011/0241007 | A1 | 10/2011 | Kumaki et al. |
| 2011/0278562 | A1 | 11/2011 | Kumaki et al. |
| 2011/0291088 | A1 | 12/2011 | Seo et al. |
| 2011/0309351 | A1 | 12/2011 | Kumaki et al. |
| 2012/0181921 | A1 | 7/2012 | Ono |
| 2012/0205676 | A1 | 8/2012 | Seo et al. |
| 2012/0205685 | A1 | 8/2012 | Seo et al. |
| 2012/0205686 | A1 | 8/2012 | Seo et al. |
| 2012/0206675 | A1 | 8/2012 | Seo et al. |
| 2012/0241782 | A1 | 9/2012 | Asaki et al. |
| 2012/0261685 | A1 | 10/2012 | Asaki et al. |
| 2013/0207138 | A1 | 8/2013 | Kashiwabara et al. |

FOREIGN PATENT DOCUMENTS

| | | |
|---|---|---|
| CN | 001947468 A | 4/2007 |
| CN | 101365271 A | 2/2009 |
| CN | 102054936 A | 5/2011 |
| EP | 1 244 153 A2 | 9/2002 |
| EP | 1 672 962 A1 | 6/2006 |
| EP | 1 744 600 A1 | 1/2007 |
| EP | 2 509 397 A1 | 10/2012 |
| JP | 06-275381 A | 9/1994 |
| JP | 2001-043980 A | 2/2001 |
| JP | 2002-299057 A | 10/2002 |
| JP | 2004-079421 A | 3/2004 |
| JP | 2005-093401 A | 4/2005 |
| JP | 2006-032327 A | 2/2006 |
| JP | 2006-126817 A | 5/2006 |
| JP | 2007-503093 | 2/2007 |
| JP | 2007-242498 A | 9/2007 |
| JP | 2009-117500 A | 5/2009 |
| JP | 2009-123404 A | 6/2009 |
| JP | 2009-266459 A | 11/2009 |
| JP | 2009-266524 A | 11/2009 |
| JP | 2010-003577 A | 1/2010 |
| WO | WO 2005/109543 A2 | 11/2005 |
| WO | WO 2005/109964 A1 | 11/2005 |

OTHER PUBLICATIONS

Matsumoto, T. et al., "27.5L: Late-News Paper: Multiphoton Organic EL Device Having Charge Generation Layer," SID Digest '03: SID International Symposium Digest of Technical Papers, 2003, vol. 34, pp. 979-981.

Chinese Office Action re Application No. CN 201210109868.6, dated Aug. 18, 2015.

Chinese Office Action re Application No. CN 201610703179.6, dated Jul. 3, 2017.

* cited by examiner

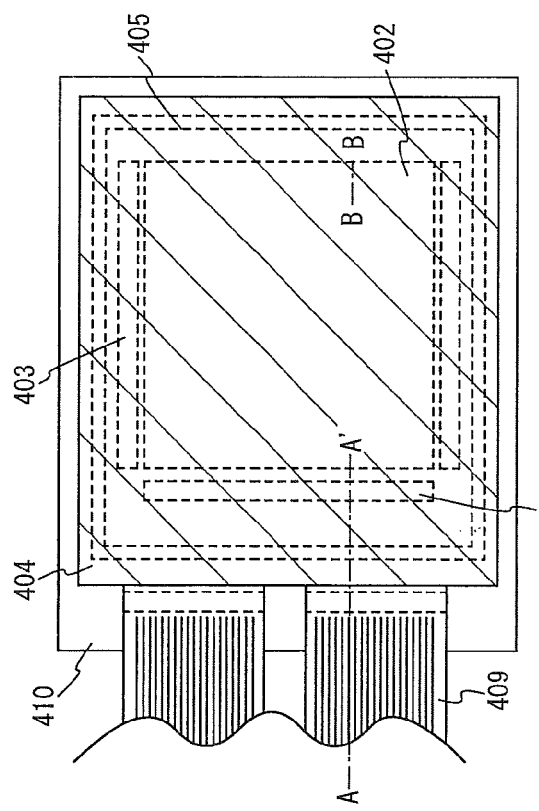
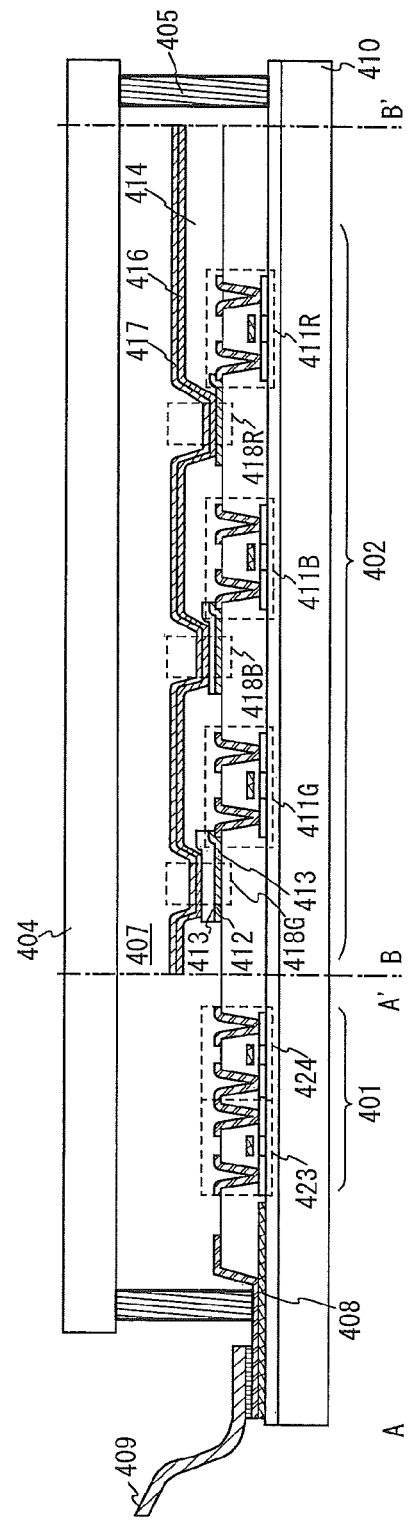
FIG. 4A
FIG. 4B

FIG. 5A
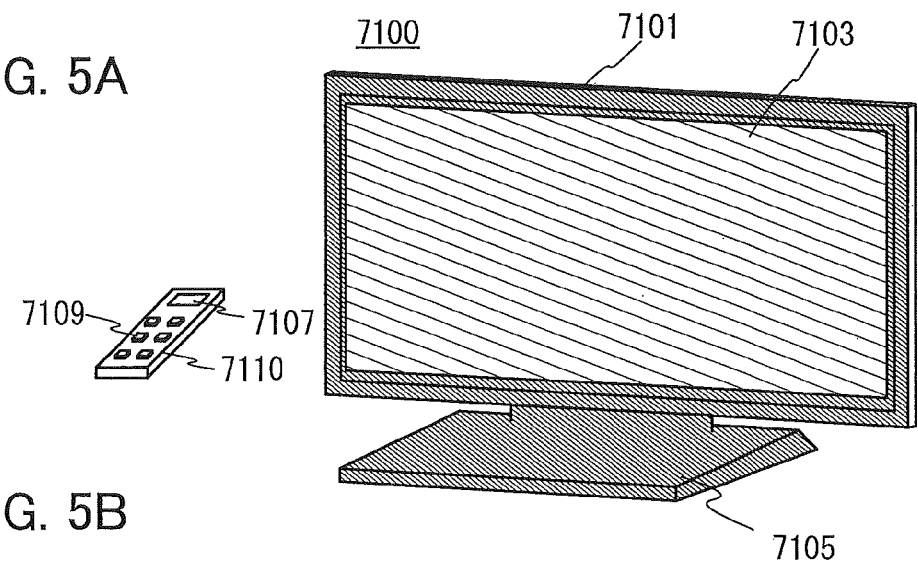
FIG. 5B
FIG. 5C
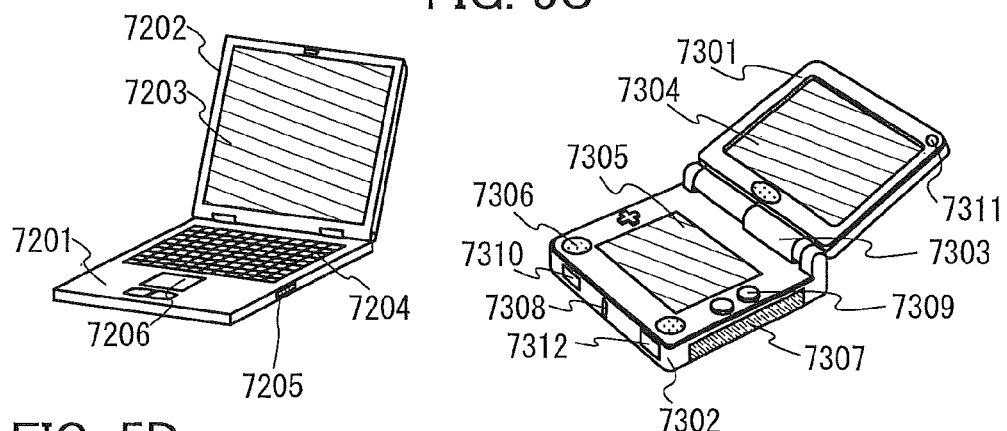
FIG. 5D
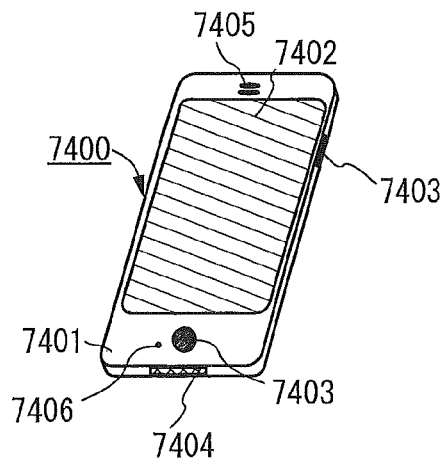

LIGHT-EMITTING DEVICE, ELECTRONIC APPLIANCE, AND LIGHTING DEVICE COMPRISING A LIGHT-EMITTING ELEMENT HAVING OPTIMIZED OPTICAL PATH LENGTH

This application is a divisional of copending U.S. application Ser. No. 13/439,329, filed on Apr. 4, 2012 which is incorporated herein by reference.

BACKGROUND OF THE INVENTION

1. Field of the Invention

The present invention relates to a light-emitting device and a lighting device which utilize electroluminescence.

2. Description of the Related Art

In recent years, research and development have been extensively conducted on light-emitting elements utilizing electroluminescence (EL). In a basic structure of such a light-emitting element, a layer containing a light-emitting substance (an EL layer) is interposed between a pair of electrodes. By voltage application to this element, light emission can be obtained from the light-emitting substance.

Since such a light-emitting element is of self-light-emitting type, it is considered that the light-emitting element has advantages over a liquid crystal display, such as high pixel visibility and the eliminated need for a backlight. Accordingly, such a light-emitting element is thought to be suitable as a flat panel display element. Such a light-emitting element is also highly advantageous in that it can be thin and lightweight. Further, very high speed response is also one of the features of such an element.

Furthermore, since such a light-emitting element can be formed into a film form, planar light emission can be easily obtained. Therefore, a large-area element using planar light emission can be formed. This is a feature which is difficult to obtain with point light sources typified by incandescent lamps and LEDs or linear light sources typified by fluorescent lamps. Thus, the light-emitting element also has great potential as a planar light source applicable to a lighting device or the like.

In order to apply such a light-emitting element to a light-emitting device, the light-extraction efficiency of the light-emitting element needs to be improved. As a method of improving the light-extraction efficiency of a light-emitting element, a structure in which a micro optical resonator (a microcavity) utilizing a resonant effect of light between a pair of electrodes is used and regions having different cavity lengths are provided to improve the viewing angle dependence of a light-emitting element (e.g., see Patent Document 1), and the like have been proposed.

REFERENCE

Patent Document

[Patent Document 1] Japanese Published Patent Application No. 2006-032327

SUMMARY OF THE INVENTION

Light-emitting elements utilizing a microcavity system are advantageous for full color display. For example, unlike light-emitting elements which are separately formed depending on the colors R, G, and B, the light-emitting elements utilizing a microcavity system do not need to be separately formed depending on the colors R, G, and B; thus, higher definition can be easily achieved. As compared with a light-emitting element using a color filter (CF) system, the light-emitting elements utilizing a microcavity system can have low power consumption.

In the case where full color display is performed with the light-emitting elements utilizing a microcavity system, it is necessary to adjust the distance between a pair of electrodes in pixels for each emission color. However, there is a problem in that color purity is decreased in some pixels in which a plurality of wavelengths coexists. There is also a problem of an increase in the number of masks and steps needed for the adjustment of the distance between the pair of electrodes.

Thus, according to one embodiment of the present invention, a light-emitting device and a lighting device each of which includes a plurality of light-emitting elements exhibiting light with different wavelengths and utilizes a microcavity system are provided. The light-emitting device and the lighting device each have an element structure in which only light with a desired wavelength is emitted from each of the light-emitting elements, and thus the light-emitting elements have favorable color purity and high light-extraction efficiency. Moreover, the number of steps and the cost are reduced.

According to one embodiment of the present invention, a light-emitting device and a lighting device each of which includes a plurality of light-emitting elements exhibiting light with different wavelengths are provided. The light-emitting device and the lighting device each have an element structure in which only light with a desired wavelength is emitted from each of the light-emitting elements, and thus the light-emitting elements have favorable color purity. In other words, in the light-emitting element emitting light ($\lambda_R$) with the longest wavelength of the light with different wavelengths, the optical path length from a reflective electrode to a light-emitting layer (a light-emitting region) included in an EL layer is set to $\lambda_R/4$ and the optical path length from the reflective electrode to a semi-transmissive and semi-reflective electrode is set to $\lambda_R/2$.

As for a light-emitting device including three kinds of light-emitting elements emitting light ($\lambda_R$, $\lambda_G$, and $\lambda_B$) where the wavelength relation of $\lambda_R > \lambda_G > \lambda_B$ is satisfied, a case where a first light-emitting layer emitting the light with the wavelength $\lambda_R$, a second light-emitting layer emitting the light with the wavelength $\lambda_G$, and a third light-emitting layer emitting the light with the wavelength $\lambda_B$ are formed is described. In a first light-emitting element emitting the light ($\lambda_G$), the optical path length from a reflective electrode to the second light-emitting layer (G) (a light-emitting region) included in an EL layer is set to $3\lambda_G/4$ and the optical path length from the reflective electrode to a semi-transmissive and semi-reflective electrode is set to $\lambda_G$. In a second light-emitting element emitting the light ($\lambda_B$), the optical path length from the reflective electrode to the third light-emitting layer (B) (a light-emitting region) included in the EL layer is set to $3\lambda_R/4$ and the optical path length from the reflective electrode to the semi-transmissive and semi-reflective electrode is set to $\lambda_B$. In a third light-emitting element emitting the light ($\lambda_R$), the optical path length from the reflective electrode to the first light-emitting layer (R) (a light-emitting region) included in the EL layer is set to $\lambda_R/4$ and the optical path length from the reflective electrode to the semi-transmissive and semi-reflective electrode is set to $\lambda_R/2$. In this case, for adjustment of the optical path lengths, a first transparent conductive layer is provided between the reflective electrode and the EL layer in the first light-emitting element, and a second transparent conductive layer is provided between the reflective electrode and the EL layer in the second light-emitting element. Note that the first transparent conductive layer needs to be thicker than the second transparent conductive layer.

One embodiment of the present invention is a light-emitting device including a first light-emitting element including a first reflective electrode, a first transparent conductive layer in contact with the first reflective electrode, an EL layer formed in contact with the first transparent conductive layer, and a semi-transmissive and semi-reflective electrode formed in contact with the EL layer; a second light-emitting element including a second reflective electrode, a second transparent conductive layer in contact with the second reflective electrode, the EL layer formed in contact with the second transparent conductive layer, and the semi-transmissive and semi-reflective electrode formed in contact with the EL layer; and a third light-emitting element including a third reflective electrode, the EL layer formed in contact with the third reflective electrode, and the semi-transmissive and semi-reflective electrode formed in contact with the EL layer. Light emitted from the third light-emitting element has a longer wavelength than light emitted from the first light-emitting element and light emitted from the second light-emitting element.

One embodiment of the present invention is a light-emitting device including a first light-emitting element including a first reflective electrode, a first transparent conductive layer in contact with the first reflective electrode, an EL layer formed in contact with the first transparent conductive layer, and a semi-transmissive and semi-reflective electrode formed in contact with the EL layer; a second light-emitting element including a second reflective electrode, a second transparent conductive layer in contact with the second reflective electrode, the EL layer formed in contact with the second transparent conductive layer, and the semi-transmissive and semi-reflective electrode formed in contact with the EL layer; and a third light-emitting element including a third reflective electrode, the EL layer formed in contact with the third reflective electrode, and the semi-transmissive and semi-reflective electrode formed in contact with the EL layer. The EL layer includes a first light-emitting layer emitting light with a wavelength $\lambda_R$. The light with the wavelength $\lambda_R$ is emitted from the third light-emitting element. In the third light-emitting element, the optical path length from the third reflective electrode to the first light-emitting layer is $\lambda_R/4$ and the optical path length from the third reflective electrode to the semi-transmissive and semi-reflective electrode is $\lambda_R/2$.

One embodiment of the present invention is a light-emitting device including a first light-emitting element including a first reflective electrode, a first transparent conductive layer in contact with the first reflective electrode, an EL layer formed in contact with the first transparent conductive layer, and a semi-transmissive and semi-reflective electrode formed in contact with the EL layer; a second light-emitting element including a second reflective electrode, a second transparent conductive layer in contact with the second reflective electrode, the EL layer formed in contact with the second transparent conductive layer, and the semi-transmissive and semi-reflective electrode formed in contact with the EL layer; and a third light-emitting element including a third reflective electrode, the EL layer formed in contact with the third reflective electrode, and the semi-transmissive and semi-reflective electrode formed in contact with the EL layer. The EL layer includes a first light-emitting layer emitting light with a wavelength $\lambda_R$, a second light-emitting layer emitting light with a wavelength $\lambda_G$, and a third light-emitting layer emitting light with a wavelength $\lambda_B$, where the wavelength relation of $\lambda_R > \lambda_G > \lambda_B$ is satisfied. The light with the wavelength $\lambda_G$ is emitted from the first light-emitting element. In the first light-emitting element, the optical path length from the first reflective electrode to the second light-emitting layer is $3\lambda_G/4$ and the optical path length from the first reflective electrode to the semi-transmissive and semi-reflective electrode is $\lambda_G$. The light with the wavelength $\lambda_B$ is emitted from the second light-emitting element. In the second light-emitting element, the optical path length from the second reflective electrode to the third light-emitting layer is $3\lambda_B/4$ and the optical path length from the second reflective electrode to the semi-transmissive and semi-reflective electrode is $\lambda_B$. The light with the wavelength $\lambda_R$ is emitted from the third light-emitting element. In the third light-emitting element, the optical path length from the third reflective electrode to the first light-emitting layer is $\lambda_R/4$ and the optical path length from the third reflective electrode to the semi-transmissive and semi-reflective electrode is $\lambda_R/2$.

Further, as for a light-emitting device including three kinds of light-emitting elements emitting light ($\lambda_R$, $\lambda_G$, and $\lambda_B$) where the wavelength relation of $\lambda_R > \lambda_G > \lambda_B$ is satisfied, a case where a first light-emitting layer emitting light with a wavelength $\lambda_Y$ and a second light-emitting layer emitting the light with the wavelength $\lambda_B$ are formed is described. In a first light-emitting element emitting the light ($\lambda_G$), the optical path length from a reflective electrode to the first light-emitting layer (Y) (a light-emitting region) included in an EL layer is set to $3\lambda_G/4$ and the optical path length from the reflective electrode to a semi-transmissive and semi-reflective electrode is set to $\lambda_G$. In a second light-emitting element emitting the light ($\lambda_B$), the optical path length from the reflective electrode to the second light-emitting layer (B) (a light-emitting region) included in the EL layer is set to $3\lambda_B/4$ and the optical path length from the reflective electrode to the semi-transmissive and semi-reflective electrode is set to $\lambda_B$. In a third light-emitting element emitting the light ($\lambda_R$), the optical path length from the reflective electrode to the first light-emitting layer (Y) (a light-emitting region) included in the EL layer is set to $\lambda_R/4$ and the optical path length from the reflective electrode to the semi-transmissive and semi-reflective electrode is set to $\lambda_R/2$. Also in this case, for adjustment of the optical path lengths, a first transparent conductive layer is provided between the reflective electrode and the EL layer in the first light-emitting element, and a second transparent conductive layer is provided between the reflective electrode and the EL layer in the second light-emitting element. Note that the first transparent conductive layer needs to be thicker than the second transparent conductive layer.

One embodiment of the present invention is a light-emitting device including a first light-emitting element including a first reflective electrode, a first transparent conductive layer in contact with the first reflective electrode, an EL layer formed in contact with the first transparent conductive layer, and a semi-transmissive and semi-reflective electrode formed in contact with the EL layer; a second light-emitting element including a second reflective electrode, a second transparent conductive layer in contact with the second reflective electrode, the EL layer formed in contact with the second transparent conductive layer, and the semi-transmissive and semi-reflective electrode formed in contact with the EL layer; and a third light-emitting element including a third reflective electrode, the EL layer formed in contact with the third reflective electrode, and the semi-transmissive and semi-reflective electrode formed in contact with the EL layer. The EL layer includes a first light-emitting layer emitting light with a wavelength $\lambda_Y$. Light with a wavelength $\lambda_R$ is emitted from the third light-emitting element. In the third light-emitting element, the optical path length from the third reflective electrode to the first light-emitting layer is $\lambda_R/4$ and the optical path length from the third reflective electrode to the semi-transmissive and semi-reflective electrode is $\lambda_R/2$.

One embodiment of the present invention is a light-emitting device including a first light-emitting element including a first reflective electrode, a first transparent conductive layer in contact with the first reflective electrode, an EL layer formed in contact with the first transparent conductive layer, and a semi-transmissive and semi-reflective electrode formed in contact with the EL layer; a second light-emitting element including a second reflective electrode, a second transparent conductive layer in contact with the second reflective electrode, the EL layer formed in contact with the second transparent conductive layer, and the semi-transmissive and semi-reflective electrode formed in contact with the EL layer; and a third light-emitting element including a third reflective electrode, the EL layer formed in contact with the third reflective electrode, and the semi-transmissive and semi-reflective electrode formed in contact with the EL layer. The EL layer includes a first light-emitting layer emitting light with a wavelength $\lambda_Y$ and a second light-emitting layer emitting light with a wavelength $4$, where the wavelength relation of $\lambda_R > \lambda_Y > \lambda_G > \lambda_B$ is satisfied. Light with the wavelength $\lambda_G$ is emitted from the first light-emitting element. In the first light-emitting element, the optical path length from the first reflective electrode to the first light-emitting layer is $3\lambda_G/4$ and the optical path length from the first reflective electrode to the semi-transmissive and semi-reflective electrode is $\lambda_G$. The light with the wavelength $\lambda_B$ is emitted from the second light-emitting element. In the second light-emitting element, the optical path length from the second reflective electrode to the second light-emitting layer is $3\lambda_B/4$ and the optical path length from the second reflective electrode to the semi-transmissive and semi-reflective electrode is $\lambda_B$. Light with the wavelength $\lambda_R$ is emitted from the third light-emitting element. In the third light-emitting element, the optical path length from the third reflective electrode to the first light-emitting layer is $\lambda_R/4$ and the optical path length from the third reflective electrode to the semi-transmissive and semi-reflective electrode is $\lambda_R/2$.

In each of the above structures, the EL layer includes one or more of a hole-injection layer, a hole-transport layer, an electron-transport layer, and an electron-injection layer.

In each of the above structures, the first transparent conductive layer is thicker than the second transparent conductive layer.

In each of the above structures, light emitted from the first light-emitting element, light emitted from the second light-emitting element, and light emitted from the third light-emitting element have wavelengths different from each other.

One embodiment of the present invention is an electronic appliance or a lighting device which includes the light-emitting device.

According to one embodiment of the present invention, a light-emitting device and a lighting device each of which includes a plurality of light-emitting elements exhibiting light with different wavelengths and utilizes a microcavity system can be provided. The light-emitting device and the lighting device each have an element structure in which light with a desired wavelength is emitted from each of the light-emitting elements by setting the optical path length from a reflective electrode to a light-emitting layer (a light-emitting region) and the optical path length from the reflective electrode to a semi-transmissive and semi-reflective electrode to the predetermined values. Thus, the light-emitting elements can have favorable color purity and high light-extraction efficiency. Further, according to one embodiment of the present invention, a transparent conductive layer does not need to be formed in a light-emitting element from which light with the longest wavelength is extracted; accordingly, the number of steps and the cost can be reduced.

BRIEF DESCRIPTION OF THE DRAWINGS

In the accompanying drawings:

FIGS. 4A and 4B illustrate a light-emitting device according to one embodiment of the present invention;

FIGS. 5A to 5D illustrate electronic appliances;

DETAILED DESCRIPTION OF THE INVENTION

Figure 1:
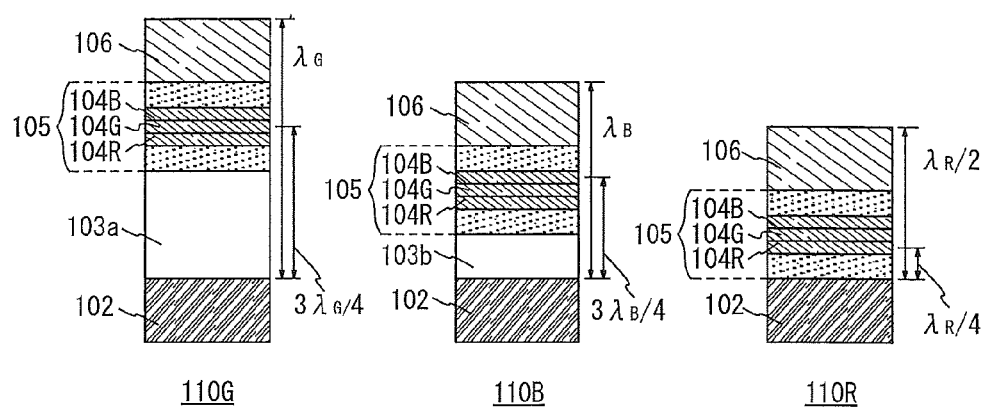
FIG. 1 illustrates a light-emitting device according to one embodiment of the present invention.

Hereinafter, embodiments and an example of the present invention will be described in detail with reference to the drawings. Note that the present invention is not limited to the description below, and modes and details thereof can be modified in various ways without departing from the spirit and scope of the present invention. Therefore, the present invention should not be construed as being limited to the description in the following embodiments and example. In addition, components denoted by the same reference numerals throughout the drawings are considered as the same components, and repeated description thereof is omitted.

(Embodiment 1)

In this embodiment, a light-emitting device according to one embodiment of the present invention will be described with reference to FIG. 1. Note that hereinafter, an optical path length represents the thickness of a component.

As illustrated in FIG. 1, the light-emitting device according to one embodiment of the present invention includes light-emitting elements (a first light-emitting element (G) 110G, a second light-emitting element (B) 110B, and a third light-emitting element (R) 110R) having different structures.

The first light-emitting element (G) 110G has a structure in which a first transparent conductive layer 103a; an EL layer 105 including a first light-emitting layer (R) 104R, a second light-emitting layer (G) 104G, and a third light-emitting layer (B) 104B in part; and a semi-transmissive and semi-reflective electrode 106 are sequentially stacked over a reflective electrode 102. The second light-emitting element (B) 110B has a structure in which a second transparent conductive layer 103b, the EL layer 105, and the semi-transmissive and semi-reflective electrode 106 are sequentially stacked over the reflective electrode 102. The third light-emitting element (R) 110R has a structure in which the EL layer 105 and the semi-transmissive and semi-reflective electrode 106 are sequentially stacked over the reflective electrode 102.

Note that the reflective electrode 102, the EL layer 105, and the semi-transmissive and semi-reflective electrode 106 are common to the light-emitting elements (the first light-emitting element (G) 1106, the second light-emitting element (B) 110B, and the third light-emitting element (R) 110R). The first light-emitting layer (R) 104R emits light ($\lambda_R$) having a peak in a wavelength range from 600 nm to 760 nm. The second light-emitting layer (G) 104G emits light ($\lambda_G$) having a peak in a wavelength range from 500 nm to 550 nm. The third light-emitting layer (B) 104B emits light ($\lambda_B$) having a peak in a wavelength range from 420 nm to 480 nm. Thus, in each of the light-emitting elements (the first light-emitting element (G) 110G, the second light-emitting element (B) 110B, and the third light-emitting element (R) 110R), light emitted from the first light-emitting layer (R) 104R, light emitted from the second light-emitting layer (G) 104G, and light emitted from the third light-emitting layer (B) 104B overlap with each other; accordingly, light having a broad emission spectrum that covers a visible light range can be emitted. Note that the above wavelengths satisfy the relation of $\lambda_B<\lambda_G<\lambda_R$.

Each of the light-emitting elements described in this embodiment has a structure in which the EL layer 105 is interposed between the reflective electrode 102 and the semi-transmissive and semi-reflective electrode 106. Light emitted in all directions from the light-emitting layers included in the EL layer 105 is resonated by the reflective electrode 102 and the semi-transmissive and semi-reflective electrode 106 which function as a micro optical resonator (a microcavity). Note that the reflective electrode 102 is formed using a conductive material having reflectivity, and a film whose visible light reflectivity is 40% to 100%, preferably 70% to 100%, and whose resistivity is lower than or equal to $1\times10^{-2}$ Ωcm is used. In addition, the semi-transmissive and semi-reflective electrode 106 is formed using a conductive material having reflectivity and a conductive material having a light-transmitting property, and a film whose visible light reflectivity is 20% to 80%, preferably 40% to 70%, and whose resistivity is lower than or equal to $1\times10^{-2}$ Ωcm is used.

In this embodiment, the thicknesses of the transparent conductive layers (the first transparent conductive layer 103a and the second transparent conductive layer 103b) provided in the first light-emitting element (G) 110G and the second light-emitting element (B) 110B, respectively, are varied between the light-emitting elements, whereby the light-emitting elements differ in the optical path length from the reflective electrode 102 to the semi-transmissive and semi-reflective electrode 106. In other words, in light having a broad emission spectrum, which is emitted from the light-emitting layers of each of the light-emitting elements, light with a wavelength that is resonated between the reflective electrode 102 and the semi-transmissive and semi-reflective electrode 106 can be enhanced while light with a wavelength that is not resonated therebetween can be attenuated. Thus, when the elements differ in the optical path length from the reflective electrode 102 to the semi-transmissive and semi-reflective electrode 106, light with different wavelengths can be extracted.

Note that the total thickness (optical path length) from the reflective electrode 102 to the semi-transmissive and semi-reflective electrode 106 is set to $\lambda_G$ in the first light-emitting element (G) 110G; the total thickness (optical path length) from the reflective electrode 102 to the semi-transmissive and semi-reflective electrode 106 is set to in the second light-emitting element (B) 110B; and the total thickness (optical path length) from the reflective electrode 102 to the semi-transmissive and semi-reflective electrode 106 is set to $\lambda_R/2$ in the third light-emitting element (R) 110R.

In this manner, the light ($\lambda_G$) emitted from the second light-emitting layer (G) 104G included in the EL layer 105 is mainly extracted from the first light-emitting element (G) 110G, the light ($\lambda_B$) emitted from the third light-emitting layer (B) 104B included in the EL layer 105 is mainly extracted from the second light-emitting element (B) 110B, and the light ($\lambda_R$) emitted from the first light-emitting layer (R) 104R included in the EL layer 105 is mainly extracted from the third light-emitting element (R) 110R. Note that the light extracted from each of the light-emitting elements is emitted through the semi-transmissive and semi-reflective electrode 106 side.

In the above structure, the total thickness (optical path length) from the reflective electrode 102 to the semi-transmissive and semi-reflective electrode 106 is set to $\lambda_R/2$ in the third light-emitting element (R) 110R; if the total thickness (optical path length) from the reflective electrode 102 to the semi-transmissive and semi-reflective electrode 106 is set to 4 in the third light-emitting element (R) 110R, from which the light ($\lambda_R$) with the longest wavelength is extracted, the light ($\lambda_B$) is also resonated. Therefore, by setting the total thickness (optical path length) from the reflective electrode 102 to the semi-transmissive and semi-reflective electrode 106 to $\lambda_R/2$ in the third light-emitting element (R) 110R, only the light ($\lambda_R$) can be extracted. Note that even when the total thicknesses (optical path lengths) from the reflective electrode 102 to the semi-transmissive and semi-reflective electrode 106 are set to $\lambda_G$ and $\lambda_B$ in the first light-emitting element (G) 110G and the second light-emitting element (B) 110B, respectively, from which light with wavelengths shorter than that of light from the third light-emitting element (R) 110R is extracted, it is possible to extract only light with desired wavelengths. Here, strictly speaking, the total thickness (optical path length) from the reflective electrode 102 to the semi-transmissive and semi-reflective electrode 106 can be the total thickness (optical path length) from a reflection region in the reflective electrode 102 to a reflection region in the semi-transmissive and semi-reflective electrode 106. However, it is difficult to precisely determine the positions of the reflection regions in the reflective electrode 102 and the semi-transmissive and semi-reflective electrode 106; therefore, it is assumed that the above effect can be sufficiently obtained wherever the reflection regions may be set in the reflective electrode 102 and the semi-transmissive and semi-reflective electrode 106. Note that the light extracted from each of the light-emitting elements does not necessarily have the same peak as the emitted light. For example, light having a peak at 460 nm may be emitted from the light-emitting layer, and light having a peak at 450 nm may be extracted from the first light-emitting element (G) 110G.

Next, in the first light-emitting element (G) 110G, the optical path length from the reflective electrode 102 to the second light-emitting layer (G) 104G is adjusted to a desired thickness ($3\lambda_G/4$); thus, light emitted from the second light-emitting layer (G) 104G can be amplified. Light (first reflected light) that is reflected by the reflective electrode 102 of the light emitted from the second light-emitting layer (G) 104G interferes with light (first incident light) that directly enters the semi-transmissive and semi-reflective electrode 106 from the second light-emitting layer (G) 104G Therefore, by adjusting the optical path length from the reflective electrode 102 to the second light-emitting layer (G) 104G to the desired value ($3\lambda_G/4$), the phases of the first reflected light and the first incident light can be aligned with each other and the light emitted from the second light-emitting layer (G) 104G can be amplified.

Note that even when the optical path length from the reflective electrode 102 to the second light-emitting layer (G) 104G is set to $\lambda_G/4$, the first incident light and the first reflected light are enhanced by interfering with each other; however, since the thickness of the first transparent conductive layer 103a is larger than $\lambda_G/4$, the optical path length is adjusted to the value $3\lambda_G/4$ which is larger than $\lambda_G/4$ and enables the first incident light and the first reflected light to be enhanced by interfering with each other. Here, strictly speaking, the optical path length from the reflective electrode 102 to the second light-emitting layer (G) 104G can be the optical path length from a reflection region in the reflective electrode 102 to a light-emitting region in the second light-emitting layer (G) 104E However, it is difficult to precisely determine the positions of the reflection region in the reflective electrode 102 and the light-emitting region in the second light-emitting layer (G) 104G; therefore, it is assumed that the above effect can be sufficiently obtained wherever the reflection region and the light-emitting region may be set in the reflective electrode 102 and the second light-emitting layer (G) 1046, respectively.

Next, in the second light-emitting element (B) 110B, the optical path length from the reflective electrode 102 to the third light-emitting layer (B) 104B is adjusted to a desired thickness ($3\lambda_R/4$); thus, light emitted from the third light-emitting layer (B) 104B can be amplified. Light (second reflected light) that is reflected by the reflective electrode 102 of the light emitted from the third light-emitting layer (B) 104B interferes with light (second incident light) that directly enters the semi-transmissive and semi-reflective electrode 106 from the third light-emitting layer (B) 104B. Therefore, by adjusting the optical path length from the reflective electrode 102 to the third light-emitting layer (B) 104B to the desired value ($3\lambda_B/4$), the phases of the second reflected light and the second incident light can be aligned with each other and the light emitted from the third light-emitting layer (B) 104B can be amplified.

Note that even when the optical path length from the reflective electrode 102 to the third light-emitting layer (B) 104B is set to $\lambda_B/4$, the second incident light and the second reflected light are enhanced by interfering with each other; however, since the thickness of the second transparent conductive layer 103b is larger than $\lambda_B/4$, the optical path length is adjusted to the value $3\lambda_B/4$ which is larger than $\lambda_B/4$ and enables the second incident light and the second reflected light to be enhanced by interfering with each other. Here, strictly speaking, the optical path length from the reflective electrode 102 to the third light-emitting layer (B) 104B can be the optical path length from a reflection region in the reflective electrode 102 to a light-emitting region in the third light-emitting layer (B) 104B. However, it is difficult to precisely determine the positions of the reflection region in the reflective electrode 102 and the light-emitting region in the third light-emitting layer (B) 104B; therefore, it is assumed that the above effect can be sufficiently obtained wherever the reflection region and the light-emitting region may be set in the reflective electrode 102 and the third light-emitting layer (B) 104B, respectively.

Next, in the third light-emitting element (R) 110R, the optical path length from the reflective electrode 102 to the first light-emitting layer (R) 104R is adjusted to a desired thickness ($\lambda_R/4$); thus, light emitted from the first light-emitting layer (R) 104R can be amplified. Light (third reflected light) that is reflected by the reflective electrode 102 of the light emitted from the first light-emitting layer (R) 104R interferes with light (third incident light) that directly enters the semi-transmissive and semi-reflective electrode 106 from the first light-emitting layer (R) 104R. Therefore, by adjusting the optical path length from the reflective electrode 102 to the first light-emitting layer (R) 104R to the desired value ($\lambda_R/4$), the phases of the third reflected light and the third incident light can be aligned with each other and the light emitted from the first light-emitting layer (R) 104R can be amplified.

Note that, strictly speaking, the optical path length from the reflective electrode 102 to the first light-emitting layer (R) 104R in the third light-emitting element can be the optical path length from a reflection region in the reflective electrode 102 to a light-emitting region in the first light-emitting layer (R) 104R. However, it is difficult to precisely determine the positions of the reflection region in the reflective electrode 102 and the light-emitting region in the first light-emitting layer (R) 104R; therefore, it is assumed that the above effect can be sufficiently obtained wherever the reflection region and the light-emitting region may be set in the reflective electrode 102 and the first light-emitting layer (R) 104R, respectively.

With the above structure, light with wavelengths which differ among the light-emitting elements including the same EL layer can be efficiently extracted. Accordingly, a light-emitting device having favorable color purity and high light-extraction efficiency can be provided. Further, with the structure described in this embodiment, a transparent conductive layer does not need to be formed in the light-emitting element from which light with the longest wavelength is extracted; accordingly, the number of steps and the cost can be reduced.

Note that the structure described in this embodiment can be combined as appropriate with any of the structures described in the other embodiments.

(Embodiment 2)

Figure 2A:
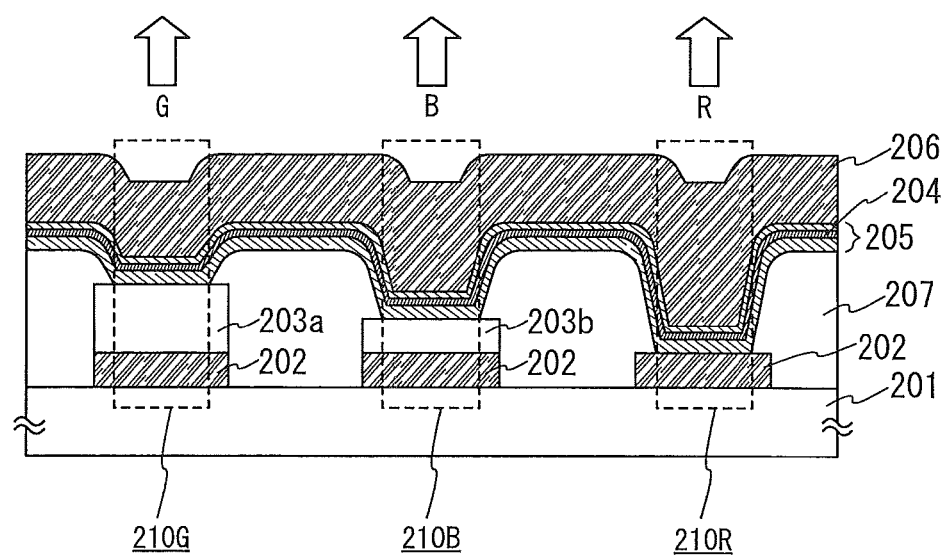
FIGS. 2A and 2B illustrate a light-emitting device according to one embodiment of the present invention.
Figure 2B:
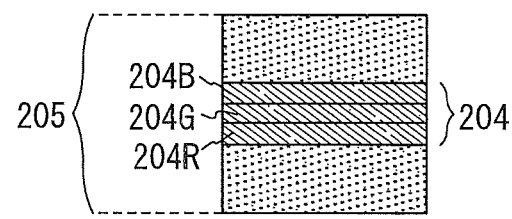

In this embodiment, a specific structure of the light-emitting device according to one embodiment of the present invention, which is described in Embodiment 1, will be described with reference to FIGS. 2A and 2B.

A light-emitting device described in this embodiment includes a first light-emitting element (G) 210G in which a reflective electrode 202, a first transparent conductive layer 203a, an EL layer 205 including a light-emitting layer 204, and a semi-transmissive and semi-reflective electrode 206 are sequentially stacked over a substrate 201; a second light-emitting element (B) 210B in which the reflective electrode 202, a second transparent conductive layer 203b, the EL layer 205 including the light-emitting layer 204, and the semi-transmissive and semi-reflective electrode 206 are sequentially stacked over the substrate 201; and a third light-emitting element (R) 210R in which the reflective electrode 202, the EL layer 205 including the light-emitting layer 204, and the semi-transmissive and semi-reflective electrode 206 are sequentially stacked over the substrate 201.

Plastic (an organic resin), glass, quartz, or the like can be used for the substrate 201. As an example of plastic, a member made of polycarbonate, polyarylate, polyethersulfone, or the like can be given. Plastic is preferably used for the substrate 201, in which case a reduction in the weight of the light-emitting device can be achieved. Alternatively, a sheet with a high barrier property against water vapor and a high heat radiation property (e.g., a sheet containing diamond like carbon (DLC)) can be used as the substrate 201.

Although not illustrated, an inorganic insulator may be provided over the substrate 201. The inorganic insulator functions as a protective layer or a sealing film which blocks an external contaminant such as water. By providing the inorganic insulator, deterioration of the light-emitting element can be suppressed; thus, the durability and lifetime of the light-emitting device can be improved.

A single layer or a stack of a nitride film and a nitride oxide film can be used as the inorganic insulator. Specifically, the inorganic insulator can be formed using silicon oxide, silicon nitride, silicon oxynitride, aluminum oxide, aluminum nitride, aluminum oxynitride, or the like by a CVD method, a sputtering method, or the like depending on the material. It is preferable that the inorganic insulator be formed using silicon nitride by a CVD method. The thickness of the inorganic insulator may be approximately greater than or equal to 100 nm and less than or equal to 1 μm. Alternatively, an aluminum oxide film, a DLC film, a carbon film containing nitrogen, or a film containing zinc sulfide and silicon oxide (a $ZnS.SiO_2$ film) may be used as the inorganic insulator.

The reflective electrode 202 is formed using a conductive material having reflectivity. Note that a film formed using the conductive material having reflectivity has a visible light reflectivity of 40% to 100%, preferably 70% to 100%, and a resistivity lower than or equal to $1 \times 10^{-2}$ Ωcm. As the material having reflectivity, a metal material such as aluminum, gold, platinum, silver, nickel, tungsten, chromium, molybdenum, iron, cobalt, copper, or palladium can be used. In addition, any of the following can be used: alloys containing aluminum (aluminum alloys) such as an alloy of aluminum and titanium, an alloy of aluminum and nickel, and an alloy of aluminum and neodymium; and an alloy containing silver such as an alloy of silver and copper. An alloy of silver and copper is preferable because of its high heat resistance. Further, a metal film or a metal oxide film is stacked on an aluminum alloy film, whereby oxidation of the aluminum alloy film can be suppressed. As examples of a material for the metal film or the metal oxide film, titanium and titanium oxide are given.

The first transparent conductive layer 203a and the second transparent conductive layer 203b are each formed to have a single-layer structure or a layered structure using a conductive material having a light-transmitting property. A film formed using the conductive material having a light-transmitting property has a visible light transmittance higher than or equal to 40% and a resistivity lower than or equal to $1 \times 10^{-2}$ Ωcm. As the conductive material having a light-transmitting property, indium oxide ($In_2O_3$), tin oxide ($SnO_2$), zinc oxide (ZnO), indium oxide-tin oxide ($In_2O_3$—$SnO_2$, abbreviated as ITO), indium oxide-zinc oxide ($In_2O_3$—ZnO, abbreviated as IZO), zinc oxide to which gallium is added, any of these metal oxide materials containing silicon oxide, graphene, or the like can be used.

The first transparent conductive layer 203a and the second transparent conductive layer 203b can be formed using a conductive composition containing a conductive macromolecule (also referred to as conductive polymer). As the conductive macromolecule, a so-called π-electron conjugated conductive polymer can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Note that the thickness of each of the first transparent conductive layer 203a and the second transparent conductive layer 203b needs to be adjusted as appropriate in accordance with the wavelength of light to be emitted from the light-emitting element. Therefore, the first transparent conductive layer 203a in the first light-emitting element (G) 210G is formed to have a thickness which enables only light from a second light-emitting layer (G) 204G to be emitted through the semi-transmissive and semi-reflective electrode 206 side. The second transparent conductive layer 203b in the second light-emitting element (B) 210B is formed to have a thickness which enables only light from a third light-emitting layer (B) 204B to be emitted through the semi-transmissive and semi-reflective electrode 206 side.

Note that the reflective electrode 202, the first transparent conductive layer 203a, and the second transparent conductive layer 203b can each be processed into a desired shape in a photolithography step and an etching step.

An insulating layer 207 formed using an insulating material is provided between the light-emitting elements so as to cover end portions of the reflective electrode 202, the first transparent conductive layer 203a, and the second transparent conductive layer 203b. The insulating layer 207 can be formed to have a single-layer structure or a layered structure using an organic insulating material (a material containing polyimide, polyamide, polyimideamide, benzocyclobutene, or siloxane polymer as a main component), an inorganic insulating material (a material containing silicon oxide, silicon nitride, silicon oxynitride, or the like as a main component), or the like.

Further, the insulating layer 207 may be formed using a light-blocking material that reflects or absorbs light. For example, a black organic resin can be used, which can be formed by mixing a black resin of a pigment material, carbon black, titanium black, or the like into a resin material such as photosensitive or non-photosensitive polyimide. Alternatively, a light-blocking metal film can be used, which may be formed using chromium, molybdenum, nickel, titanium, cobalt, copper, tungsten, or aluminum, for example. The insulating layer 207 having a light-blocking property can prevent light leakage to an adjacent light-emitting element, which leads to high-contrast and high-definition display.

Note that there is no particular limitation on the method of forming the insulating layer 207, and a dry method such as an evaporation method, a sputtering method, or a CVD method or a wet method such as spin coating, dip coating, spray coating, a droplet discharging method (such as an inkjet method), screen printing, or offset printing may be used depending on the material. As needed, an etching method (dry etching or wet etching) may be employed to form a desired pattern.

The EL layer 205 includes at least the light-emitting layer 204. Note that the EL layer may include another functional layer in addition to the light-emitting layer 204. Specifically, the EL layer 205 can have a layered structure including a hole-injection layer, a hole-transport layer, an electron-transport layer, an electron-injection layer, a charge generation layer, and/or the like.

The hole-injection layer is a layer containing a substance having a high hole-injection property. As the substance having a high hole-injection property, for example, a metal oxide such as molybdenum oxide, titanium oxide, vanadium oxide, rhenium oxide, ruthenium oxide, chromium oxide, zirconium oxide, hafnium oxide, tantalum oxide, silver oxide, tungsten oxide, or manganese oxide can be used. Alternatively, a phthalocyanine-based compound such as phthalocyanine (abbreviation: H$_2$Pc) or copper(II) phthalocyanine (abbreviation: CuPc) can be used.

Further alternatively, any of the following aromatic amine compounds which are low molecular organic compounds can be used: 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Still further alternatively, a high molecular compound (such as an oligomer, a dendrimer, or a polymer) can be used. For example, the following high molecular compounds can be given: poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide] (abbreviation: PTPDMA), and poly[N,N'-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), may be used.

In particular, it is preferable to use a composite material in which an acceptor substance is mixed with an organic compound having a high hole-transport property for the hole-injection layer. With the use of the composite material in which an acceptor substance is mixed with a substance having a high hole-transport property, excellent hole injection from an anode can be obtained, which results in a reduction in the driving voltage of the light-emitting element. Such a composite material can be formed by co-evaporation of a substance having a high hole-transport property and an acceptor substance. When the hole-injection layer is formed using the composite material, holes are easily injected into the EL layer 205 from the anode.

As the organic compound for the composite material, any of a variety of compounds such as aromatic amine compounds, carbazole derivatives, aromatic hydrocarbon, and high molecular compounds (such as oligomers, dendrimers, and polymers) can be used. The organic compound for the composite material is preferably an organic compound having a high hole-transport property. Specifically, a substance having a hole mobility higher than or equal to $10^{-6}$ cm$^2$/Vs is preferably used. Note that other than the above substances, any substance that has a property of transporting more holes than electrons may be used. Organic compounds that can be used for the composite material will be specifically given below.

Examples of the organic compound that can be used for the composite material include aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP); and carbazole derivatives such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

In addition, it is possible to use any of the following aromatic hydrocarbon compounds: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, and 2,3,6,7-tetramethyl-9,10-di(1-naphthyl)anthracene.

Further alternatively, an aromatic hydrocarbon compound such as 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), or 9,10-bis[4-(2,2-diphenylvinyl)phenyl]anthracene (abbreviation: DPVPA) can be used.

Examples of an electron acceptor include organic compounds such as 7,7,8,8-tetracyano-2,3,5,6-tetrafluoroquinodimethane (abbreviation: F$_4$-TCNQ) and chloranil; and transition metal oxides. In addition, oxides of metals belonging to Groups 4 to 8 in the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting property. Among these, molybdenum oxide is especially preferable because it is stable in the air, has a low hygroscopic property, and is easily handled.

Note that the hole-injection layer may be formed using a composite material of the high molecular compound such as PVK, PVTPA, PTPDMA, or Poly-TPD, and the electron acceptor.

The hole-transport layer is a layer containing a substance having a high hole-transport property. As the substance having a high hole-transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly ones that have a hole mobility higher than or equal to $10^{-6}$ cm$^2$/Vs. Note that other than the above substances, any substance that has a property of transporting more holes than electrons may be used. The layer containing a substance having a high hole-transport property is not limited to a single layer, and two or more layers containing any of the above substances may be stacked.

A carbazole derivative such as CBP, CzPA, or PCzPA or an anthracene derivative such as t-BuDNA, DNA, or DPAnth may be used for the hole-transport layer.

Alternatively, a high molecular compound such as PVK, PVTPA, PTPDMA, or Poly-TPD can be used for the hole-transport layer.

The light-emitting layer 204 is a layer containing a light-emitting organic compound. As the light-emitting organic compound, for example, a fluorescent compound which exhibits fluorescence or a phosphorescent compound which exhibits phosphorescence can be used. FIG. 2B illustrates the details of the light-emitting layer 204 in FIG. 2A. As illustrated in the drawing, the light-emitting layer 204 has a structure in which a first light-emitting layer (R) 204R, the second light-emitting layer (G) 204G, and the third light-emitting layer (B) 204B are sequentially stacked.

Note that examples of the fluorescent compound that can be used for the first light-emitting layer (R) 204R include materials for red light emission, such as N,N,N',N'-tetrakis (4-methylphenyl)tetracene-5,11-diamine (abbreviation: p-mPhTD), and 7,14-diphenyl-N,N,N',N'-tetrakis(4-methylphenyl)acenaphtho[1,2-a]fluoranthene-3,10-diamine (abbreviation: p-mPhAFD). Examples of the phosphorescent compound include organometallic complexes such as bis[2-(2'-benzo[4,5-=]thienyl)pyridinato-N,$C^{3'}$)iridium(III) acetylacetonate (abbreviation: Ir(btp)$_2$(acac)), bis(1-phenylisoquinolinato-N,$C^{2'}$)iridium(III) acetylacetonate (abbreviation: Ir(piq)$_2$(acac), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato) iridium(III) (abbreviation: Ir(tppr)$_2$(acac)), (dipivaloylmethanato)bis(2,3,5-triphenylpyrazinato)iridium (III) (abbreviation: Ir(tppr)$_2$(dpm)), and 2,3,7,8,12,13,17,18-octaethyl-21H,23H-porphyrinplatinum(II) (abbreviation: PtOEP).

Examples of the fluorescent compound that can be used for the second light-emitting layer (G) 204G include materials for green light emission, such as N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). Examples of the phosphorescent compound include tris(2-phenylpyridinato-N,$C^{2'}$)iridium(III) (abbreviation: Ir(ppy)$_3$), bis(2-phenylpyridinato-N,$C^{2'}$)iridium(III) acetylacetonate (abbreviation: Ir(ppy)$_2$(acac)), bis(1,2-diphenyl-1H-benzimidazolato)iridium(III) acetylacetonate (abbreviation: Ir(pbi)$_2$(acac)), bis(benzo[h] quinolinato)iridium(III) acetylacetonate (abbreviation: Ir(bzq)$_2$(acac)), and tris(benzo[h] quinolinato)iridium(III) (abbreviation: Ir(bzq)$_3$).

Examples of the fluorescent compound that can be used for the third light-emitting layer (B) 204B include materials for blue light emission, such as N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl) triphenylamine (abbreviation: PCBAPA). Examples of the phosphorescent compound include bis[2-(4',6'-difluorophenyppyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium (III) picolinate (abbreviation: Ir(CF$_3$ppy)$_2$(pic)), and bis[2-(4',6'-difluorophenyl)pyridinato-N,$C^{2'}$]iridium(III) acetylacetonate (abbreviation: FIr(acac)).

In the case where a phosphorescent compound is used for each of the layers in the light-emitting layer 204, the phosphorescent compound is preferably dispersed in another substance serving as a host material. As the host material, various kinds of materials can be used, and it is preferable to use a substance which has a lowest unoccupied molecular orbital level (LUMO level) higher than that of a light-emitting substance and has a highest occupied molecular orbital level (HOMO level) lower than that of the light-emitting substance.

Specific examples of the host material are as follows: a metal complex such as tris(8-quinolinolato)aluminum(III) (abbreviation: Alq), tris(4-methyl-8-quinolinolato)aluminum(III) (abbreviation: Almq$_3$), bis(10-hydroxybenzo[h] quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato] zinc(II) (abbreviation: ZnBTZ); a heterocyclic compound such as 2-(4-biphenylyl)-5-(4-tert-butylphenyl)-1,3,4-oxadiazole (abbreviation: PBD), 1,3-bis[5-(p-tert-butylphenyl)-1, 3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyfltris(1-phenyl-1H-benzimidazole) (abbreviation: TPBI), bathophenanthroline (abbreviation: BPhen), or bathocuproine (BCP); a condensed aromatic compound such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyflanthracene (abbreviation: DPPA), 9,10-di(2-naphthyl)anthracene (abbreviation: DNA), 2-tert-butyl-9,10-di(2-naphthyl) anthracene (abbreviation: t-BuDNA), 9,9'-bianthryl (abbreviation: BANT), 9,9'-(stilbene-3,3'-diypdiphenanthrene (abbreviation: DPNS), 9,9'-(stilbene-4,4'-diyl)diphenanthrene (abbreviation: DPNS2), 3,3',3''-(benzene-1,3, 5-triyl)tripyrene (abbreviation: TPB3), 9,10-diphenylanthracene (abbreviation: DPAnth), or 6,12-dimethoxy-5,11-diphenylchrysene; and an aromatic amine compound such as N,N-dipheyl-9-[4-(10-phenyl-9-anthryl) phenyl]-9H-carbazol-3-amine (abbreviation: CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, or BSPB.

Plural kinds of materials can be used as the host material. For example, in order to suppress crystallization, a substance such as rubrene which suppresses crystallization may be further added. In addition, NPB, Alq, or the like may be further added in order to efficiently transfer energy to the phosphorescent compound serving as a guest material.

Note that when a structure in which a guest material is dispersed in a host material is employed, crystallization of the layers in the light-emitting layer 204 can be suppressed. Further, concentration quenching due to high concentration of the guest material can be suppressed.

The electron-transport layer is a layer containing a substance having a high electron-transport property. As the substance having a high electron-transport property, the following metal complexes having a quinoline skeleton or a benzoquinoline skeleton can be given, for example: tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), and bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) can be used. Besides the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like can also be used. The substances mentioned here are mainly ones that have an electron mobility higher than or equal to $10^{-6}$ cm$^2$/Vs. Further, the electron-transport layer is not limited to a single layer, and two or more layers containing any of the above substances may be stacked.

The electron-injection layer is a layer containing a substance having a high electron-injection property. For the electron-injection layer, an alkali metal, an alkaline earth metal, or a compound thereof, such as lithium, cesium, calcium, lithium fluoride, cesium fluoride, calcium fluoride, or lithium oxide, can be used. A rare earth metal compound such as erbium fluoride can also be used. Further, any of the above substances for forming the electron-transport layer can be used.

Charges are generated in the charge generation layer by applying voltage to the light-emitting element. The charge generation layer has functions of injecting holes into the EL layer from the cathode side and injecting electrons into the EL layer from the anode side.

Note that the charge generation layer can be formed using the above composite material in which an acceptor substance is mixed with an organic compound having a high hole-transport property. Further, the charge generation layer may have a layered structure including a layer containing the composite material and a layer containing another material.

In addition, the EL layer 205 can be formed by any of a variety of methods such as an evaporation method using an evaporation mask, a droplet discharging method like an inkjet method, a printing method, and a spin coating method.

The semi-transmissive and semi-reflective electrode 206 is formed using a combination (e.g., a layered film) of a thin film (preferably having a thickness less than or equal to 20 nm, further preferably having a thickness less than or equal to 10 nm) of a conductive material having reflectivity and a film of a conductive material having a light-transmitting property. Note that the film included in the semi-transmissive and semi-reflective electrode 206 has a visible light reflectivity of 20% to 80%, preferably 40% to 70%, and a resistivity lower than or equal to $1\times10^{-2}$ Ωcm.

As the conductive material having reflectivity and the conductive material having a light-transmitting property used for the semi-transmissive and semi-reflective electrode 206, any of the above materials can be used.

In this embodiment, the reflective electrode 202 and the first transparent conductive layer 203a function as an anode and the semi-transmissive and semi-reflective electrode 206 functions as a cathode in the first light-emitting element (G) 210G. The reflective electrode 202 and the second transparent conductive layer 203b function as an anode and the semi-transmissive and semi-reflective electrode 206 functions as a cathode in the second light-emitting element (B) 210B. The reflective electrode 202 functions as an anode and the semi-transmissive and semi-reflective electrode 206 functions as a cathode in the third light-emitting element (R) 210R.

As described above, the optical path lengths differ among the first light-emitting element (G) 210G, the second light-emitting element (B) 210B, and the third light-emitting element (R) 210R in the light-emitting device described in this embodiment, so that only light with a desired spectrum can be extracted from each of the light-emitting element by utilizing a microcavity and light with a desired wavelength can be amplified. Accordingly, a light-emitting device having favorable color purity and high light-extraction efficiency can be provided. Further, with the structure described in this embodiment, a transparent conductive layer does not need to be formed in the light-emitting element from which light with the longest wavelength is extracted; accordingly, the number of steps and the cost can be reduced.

Note that the structure described in this embodiment can be combined as appropriate with any of the structures described in the other embodiments.

(Embodiment 3)

In this embodiment, a structure of a light-emitting element included in a light-emitting device according to one embodiment of the present invention will be described with reference to FIG. 3. Note that hereinafter, an optical path length represents the thickness of a component.

Figure 3:
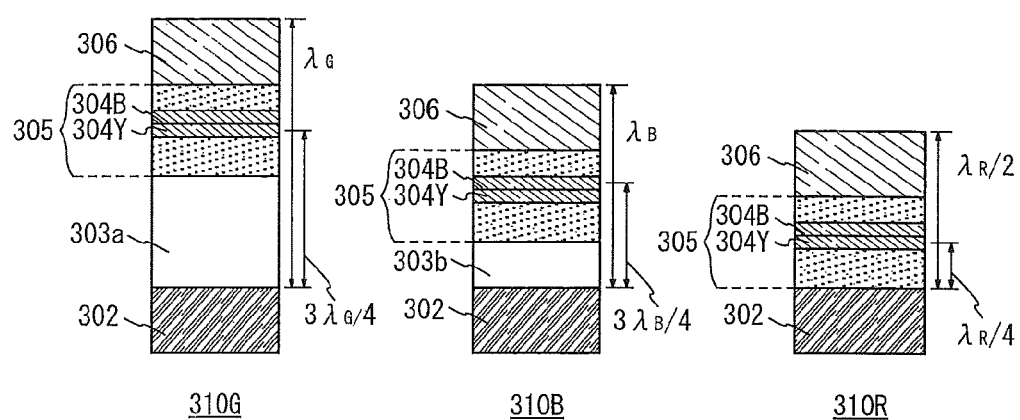
FIG. 3 illustrates a light-emitting device according to one embodiment of the present invention.

As illustrated in FIG. 3, the light-emitting device according to one embodiment of the present invention includes light-emitting elements (a first light-emitting element (G) 310G, a second light-emitting element (B) 310B, and a third light-emitting element (R) 310R) having different structures.

The first light-emitting element (G) 310G has a structure in which a first transparent conductive layer 303a; an EL layer 305 including a first light-emitting layer (Y) 304Y and a second light-emitting layer (B) 304B in part; and a semi-transmissive and semi-reflective electrode 306 are sequentially stacked over a reflective electrode 302. The second light-emitting element (B) 310B has a structure in which a second transparent conductive layer 303b, the EL layer 305, and the semi-transmissive and semi-reflective electrode 306 are sequentially stacked over the reflective electrode 302. The third light-emitting element (R) 310R has a structure in which the EL layer 305 and the semi-transmissive and semi-reflective electrode 306 are sequentially stacked over the reflective electrode 302.

Note that the reflective electrode 302, the EL layer 305, and the semi-transmissive and semi-reflective electrode 306 are common to the light-emitting elements (the first light-emitting element (G) 310G, the second light-emitting element (B) 310B, and the third light-emitting element (R) 310R). The first light-emitting layer (Y) 304Y emits light ($\lambda_Y$) having a peak in a wavelength range from 550 nm to 570 nm. The second light-emitting layer (B) 304B emits light ($\lambda_B$) having a peak in a wavelength range from 420 nm to 480 nm. Thus, in each of the light-emitting elements (the first light-emitting element (G) 310G, the second light-emitting element (B) 310B, and the third light-emitting element (R) 310R), light emitted from the first light-emitting layer (Y) 304Y and light emitted from the second light-emitting layer (B) 304B overlap with each other; accordingly, light having a broad emission spectrum that covers a visible light range can be emitted. Note that the above wavelengths satisfy the relation of $\lambda_B<\lambda_Y$.

Each of the light-emitting elements described in this embodiment has a structure in which the EL layer 305 is interposed between the reflective electrode 302 and the semi-transmissive and semi-reflective electrode 306. Light emitted in all directions from the light-emitting layers included in the EL layer 305 is resonated by the reflective electrode 302 and the semi-transmissive and semi-reflective electrode 306 which function as a micro optical resonator (a microcavity). Note that the reflective electrode 302 is formed using a conductive material having reflectivity, and a film whose visible light reflectivity is 40% to 100%, preferably 70% to 100%, and whose resistivity is lower than or equal to $1\times10^{-2}$ Ωcm is used. In addition, the semi-transmissive and semi-reflective electrode 306 is formed using a conductive material having reflectivity and a conductive material having a light-transmitting property, and a film whose visible light reflectivity is 20% to 80%, preferably 40% to 70%, and whose resistivity is lower than or equal to $1\times10^{-2}$ Ωcm is used.

In this embodiment, the thicknesses of the transparent conductive layers (the first transparent conductive layer 303a and the second transparent conductive layer 303b) provided in the first light-emitting element (G) 310G and the second light-emitting element (B) 310B, respectively, are varied between the light-emitting elements, whereby the light-emitting elements differ in the optical path length from the reflective electrode 302 to the semi-transmissive and semi-reflective electrode 306. In other words, in light having a broad emission spectrum, which is emitted from the light-emitting layers of each of the light-emitting elements, light with a wavelength that is resonated between the reflective electrode 302 and the semi-transmissive and semi-reflective electrode 306 can be enhanced while light with a wavelength that is not resonated therebetween can be attenuated. Thus, when the elements differ in the optical path length from the reflective electrode 302 to the semi-transmissive and semi-reflective electrode 306, light with different wavelengths can be extracted.

Note that the total thickness (optical path length) from the reflective electrode 302 to the semi-transmissive and semi-reflective electrode 306 is set to $\lambda_G$ in the first light-emitting element (G) 310G; the total thickness (optical path length) from the reflective electrode 302 to the semi-transmissive and semi-reflective electrode 306 is set to $\lambda_B$ in the second light-emitting element (B) 310B; and the total thickness (optical path length) from the reflective electrode 302 to the semi-transmissive and semi-reflective electrode 306 is set to $\lambda_R/2$ in the third light-emitting element (R) 310R.

In this manner, light ($\lambda_G$) emitted from the first light-emitting layer (Y) 304Y included in the EL layer 305 is mainly extracted from the first light-emitting element (G) 310G, the light ($\lambda_B$) emitted from the second light-emitting layer (B) 304B included in the EL layer 305 is mainly extracted from the second light-emitting element (B) 310B, and light ($\lambda_R$) emitted from the first light-emitting layer (Y) 304Y included in the EL layer 305 is mainly extracted from the third light-emitting element (R) 310R. Note that the light ($\lambda_G$) has a peak in a wavelength range from 500 nm to 550 nm, the light ($\lambda_B$) has a peak in a wavelength range from 420 nm to 480 nm, and the light ($\lambda_R$) has a peak in a wavelength range from 600 nm to 760 nm. In addition, the light extracted from each of the light-emitting elements is emitted through the semi-transmissive and semi-reflective electrode 306 side.

In the above structure, the total thickness (optical path length) from the reflective electrode 302 to the semi-transmissive and semi-reflective electrode 306 is set to $\lambda_R/2$ in the third light-emitting element (R) 310R; if the total thickness (optical path length) from the reflective electrode 302 to the semi-transmissive and semi-reflective electrode 306 is set to $\lambda_R$ in the third light-emitting element (R) 310R, from which the light ($\lambda_R$) with the longest wavelength is extracted, the light ($\lambda_B$) is also resonated. Therefore, by setting the total thickness (optical path length) from the reflective electrode 302 to the semi-transmissive and semi-reflective electrode 306 to $\lambda_R/2$ in the third light-emitting element (R) 310R, only the light ($\lambda_R$) can be extracted. Note that even when the total thicknesses (optical path lengths) from the reflective electrode 302 to the semi-transmissive and semi-reflective electrode 306 are set to $\lambda_G$ and $\lambda_B$ in the first light-emitting element (G) 310G and the second light-emitting element (B) 310B, respectively, from which light with wavelengths shorter than that of light from the third light-emitting element (R) 310R is extracted, it is possible to extract only light having peaks at desired wavelengths. Here, strictly speaking, the total thickness (optical path length) from the reflective electrode 302 to the semi-transmissive and semi-reflective electrode 306 can be the total thickness (optical path length) from a reflection region in the reflective electrode 302 to a reflection region in the semi-transmissive and semi-reflective electrode 306. However, it is difficult to precisely determine the positions of the reflection region in the reflective electrode 302 and the reflection region in the semi-transmissive and semi-reflective electrode 306; therefore, it is assumed that the above effect can be sufficiently obtained wherever the reflection regions may be set in the reflective electrode 302 and the semi-transmissive and semi-reflective electrode 306.

Next, in the first light-emitting element (G) 310G, the optical path length from the reflective electrode 302 to the first light-emitting layer (Y) 304Y is adjusted to a desired thickness ($3\lambda_G/4$); thus, light with $\lambda_G$ of light emitted from the first light-emitting layer (Y) 304Y can be amplified. Light (first reflected light) that is reflected by the reflective electrode 302 of the light emitted from the first light-emitting layer (Y) 304Y interferes with light (first incident light) that directly enters the semi-transmissive and semi-reflective electrode 306 from the first light-emitting layer (Y) 304Y. Therefore, by adjusting the optical path length from the reflective electrode 302 to the first light-emitting layer (Y) 304Y to the desired value ($3\lambda_G/4$), the phases of the first reflected light and the first incident light can be aligned with each other and the light with $\lambda_G$ of the light emitted from the first light-emitting layer (Y) 304Y can be amplified.

Note that even when the optical path length from the reflective electrode 302 to the first light-emitting layer (Y) 304Y is set to $\lambda_G/4$, the first incident light and the first reflected light are enhanced by interfering with each other; however, since the thickness of the first transparent conductive layer 303a is larger than $\lambda_G/4$, the optical path length is adjusted to the value $3\lambda_G/4$ which is larger than $\lambda_G/4$ and enables the first incident light and the first reflected light to be enhanced by interfering with each other. Here, strictly speaking, the optical path length from the reflective electrode 302 to the first light-emitting layer (Y) 304Y can be the optical path length from a reflection region in the reflective electrode 302 to a light-emitting region in the first light-emitting layer (Y) 304Y. However, it is difficult to precisely determine the positions of the reflection region in the reflective electrode 302 and the light-emitting region in the first light-emitting layer (Y) 304Y; therefore, it is assumed that the above effect can be sufficiently obtained wherever the reflection region and the light-emitting region may be set in the reflective electrode 302 and the first light-emitting layer (Y) 304Y, respectively.

Next, in the second light-emitting element (B) 310B, the optical path length from the reflective electrode 302 to the second light-emitting layer (B) 304B is adjusted to a desired thickness ($3\lambda_R/4$); thus, light emitted from the second light-emitting layer (B) 304B can be amplified. Light (second reflected light) that is reflected by the reflective electrode 302 of the light emitted from the second light-emitting layer (B) 304B interferes with light (second incident light) that directly enters the semi-transmissive and semi-reflective electrode 306 from the second light-emitting layer (B) 304B. Therefore, by adjusting the optical path length from the reflective electrode 302 to the second light-emitting layer (B) 304B to the desired value ($3\lambda_B/4$), the phases of the second reflected light and the second incident light can be aligned with each other and the light emitted from the second light-emitting layer (B) 304B can be amplified.

Note that even when the optical path length from the reflective electrode 302 to the second light-emitting layer (B) 304B is set to $\lambda_B/4$, the second incident light and the second reflected light are enhanced by interfering with each other; however, since the thickness of the second transparent conductive layer 303b is larger than $\lambda_B/4$, the optical path length is adjusted to the value $3\lambda_B/4$ which is larger than $\lambda_B/4$ and enables the second incident light and the second reflected light to be enhanced by interfering with each other. Here, strictly speaking, the optical path length from the reflective electrode 302 to the second light-emitting layer (B) 304B can be the optical path length from a reflection region in the reflective electrode 302 to a light-emitting region in the second light-emitting layer (B) 304B. However, it is difficult to precisely determine the positions of the reflection region in the reflective electrode 302 and the light-emitting region in the second light-emitting layer (B) 304B; therefore, it is assumed that the above effect can be sufficiently obtained wherever the reflection region and the light-emitting region may be set in the reflective electrode 302 and the second light-emitting layer (B) 304B, respectively.

Next, in the third light-emitting element (R) 310R, the optical path length from the reflective electrode 302 to the first light-emitting layer (Y) 304Y is adjusted to a desired thickness ($\lambda_R/4$); thus, light with $\lambda_R$ of light emitted from the first light-emitting layer (Y) 304Y can be amplified. Light (third reflected light) that is reflected by the reflective electrode 302 of the light emitted from the first light-emitting layer (Y) 304Y interferes with light (third incident light) that directly enters the semi-transmissive and semi-reflective electrode 306 from the first light-emitting layer (Y) 304Y. Therefore, by adjusting the optical path length from the reflective electrode 302 to the first light-emitting layer (Y) 304Y to the desired value ($\lambda_R/4$), the phases of the third reflected light and the third incident light can be aligned with each other and the light with $\lambda_R$ of the light emitted from the first light-emitting layer (Y) 304Y can be amplified.

Note that, strictly speaking, the optical path length from the reflective electrode 302 to the first light-emitting layer (Y) 304Y in the third light-emitting element can be the optical path length from a reflection region in the reflective electrode 302 to a light-emitting region in the first light-emitting layer (Y) 304Y. However, it is difficult to precisely determine the positions of the reflection region in the reflective electrode 302 and the light-emitting region in the first light-emitting layer (Y) 304Y; therefore, it is assumed that the above effect can be sufficiently obtained wherever the reflection region and the light-emitting region may be set in the reflective electrode 302 and the first light-emitting layer (Y) 304Y, respectively.

This embodiment is different from Embodiments 1 and 2 only in that the first light-emitting layer (Y) 304Y and the second light-emitting layer (B) 304B are formed in the EL layer 305. Thus, the description in Embodiments 1 and 2 can be referred to for the same portions.

As for the first light-emitting layer (Y) 304Y, examples of a fluorescent compound that can be used for the first light-emitting layer (Y) 304Y include rubrene, and 5,12-bis (1,1'-biphenyl-4-yl)-6,11-diphenyltetracene (abbreviation: BPT). Examples of a phosphorescent compound include bis(2,4-diphenyl-1,3-oxazolato-N,C$^{2'}$)iridium(III) acetylacetonate (abbreviation: Ir(dpo)$_2$(acac)), bis[2-(4'-(perfluorophenylphenyl)pyridinato]iridium(III) acetylacetonate (abbreviation: Ir(p-PF-ph)$_2$(acac)), bis(2-phenylbenzothiazolato-N,C$^{2'}$)iridium(III) acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)).

In addition, the second light-emitting layer (B) 304B can be formed using any of the substances given as examples of a substance that can be used for the third light-emitting layer (B) 204B in Embodiment 2.

With the above structure, light with wavelengths which differ among the light-emitting elements including the same EL layer can be efficiently extracted. Accordingly, a light-emitting device having favorable color purity and high light-extraction efficiency can be provided. Further, with the structure described in this embodiment, a transparent conductive layer does not need to be formed in the light-emitting element from which light with the longest wavelength is extracted; accordingly, the number of steps and the cost can be reduced.

Note that the structure described in this embodiment can be combined as appropriate with any of the structures described in the other embodiments.

(Embodiment 4)

In this embodiment, a specific structure of a light-emitting device according to one embodiment of the present invention will be described with reference to FIGS. 4A and 4B. FIG. 4A is a top view illustrating a light-emitting device, and FIG. 4B is a cross-sectional view along line A-A' and line B-B' in FIG. 4A.

In FIG. 4A, reference numeral 401 denotes a driver circuit portion (a source line driver circuit), reference numeral 402 denotes a pixel portion, and reference numeral 403 denotes a driver circuit portion (a gate line driver circuit), which are shown by a dotted line. Reference numeral 404 denotes a sealing substrate, reference numeral 405 denotes a sealant, and a portion enclosed by the sealant 405 is a space 407.

Note that a lead wiring 408 is a wiring for transmitting signals that are to be input to the source line driver circuit 401 and the gate line driver circuit 403, and receives a video signal, a clock signal, a start signal, a reset signal, and the like from a flexible printed circuit (FPC) 409 which serves as an external input tettninal. Although only the FPC is illustrated here, a printed wiring board (PWB) may be attached to the FPC. The light-emitting device in this specification includes not only a light-emitting device itself but also a light-emitting device to which an FPC or a PWB is attached.

Next, a cross-sectional structure will be described with reference to FIG. 4B. The driver circuit portions and the pixel portion are formed over an element substrate 410. Here, the source line driver circuit 401 which is the driver circuit portion and three light-emitting elements (418G, 418B, and 418R) in the pixel portion 402 are illustrated. Note that as the source line driver circuit 401, a CMOS circuit which is obtained by combining an n-channel TFT 423 and a p-channel TFT 424 is formed. The driver circuit may be formed using a variety of circuits such as a CMOS circuit, a PMOS circuit, and an NMOS circuit. Although a driver-integrated type in which a driver circuit is formed over a substrate is described in this embodiment, one embodiment of the present invention is not limited to this type, and the driver circuit can be formed outside the substrate.

Further, the pixel portion 402 includes TFTs (411G, 411B, and 411R) and the plurality of light-emitting elements (418G, 418B, and 418R) which include a reflective electrode 412 (stacked with a transparent conductive layer 413, depending on the light-emitting element) electrically connected to drains of the TFTs, an EL layer 416, and a semi-transmissive and semi-reflective electrode 417. Note that an insulating layer 414 is formed to cover end portions of the reflective electrode 412 (and the transparent conductive layer 413 in the case where the transparent conductive layer is stacked thereover).

The insulating layer 414 is preferably formed so as to have a curved surface with curvature at an upper end portion or a lower end portion thereof in order to obtain favorable coverage. For example, when positive photosensitive acrylic is used as a material for the insulating layer 414, only an upper end portion of the insulating layer 414 can have a curved surface with a radius of curvature (0.2 μm to 3 μm). Alternatively, the insulating layer 414 can be formed using either a negative type photosensitive material that becomes insoluble in an etchant by light irradiation or a positive type photosensitive material that becomes soluble in an etchant by light irradiation.

The transparent conductive layer 413, the EL layer 416, and the semi-transmissive and semi-reflective electrode 417 are formed over the reflective electrode 412 in accordance with the structure of the light-emitting element. Here, the materials given in Embodiment 2 can be used as materials for the reflective electrode 412, the transparent conductive layer 413, the EL layer 416, and the semi-transmissive and semi-reflective electrode 417.

In addition, the EL layer 416 is formed by any of a variety of methods such as an evaporation method using an evaporation mask, a droplet discharging method like an inkjet method, a printing method, and a spin coating method.

The sealing substrate 404 is attached to the element substrate 410 with the sealant 405; thus, the light-emitting elements 418G, 418B, and 418R are provided in the space 407 enclosed by the element substrate 410, the sealing substrate 404, and the sealant 405. Note that the space 407 is filled with a filler, and may be filled with an inert gas (such as nitrogen or argon) or the sealant 405.

Note that as the sealant 405, an epoxy-based resin is preferably used. It is preferable that such a material do not transmit moisture or oxygen as much as possible. The sealing substrate 404 can be formed using a glass substrate; a quartz substrate; or a plastic substrate made of fiberglass-reinforced plastics (FRP), polyvinyl fluoride (PVF), polyester, acrylic, or the like.

In the above manner, the active matrix light-emitting device according to one embodiment of the present invention can be obtained. Note that the light-emitting device according to one embodiment of the present invention can be a passive matrix light-emitting device as well as the above active matrix light-emitting device.

Note that in the light-emitting device according to one embodiment of the present invention, light with wavelengths which differ among the light-emitting elements including the same EL layer can be efficiently extracted. Accordingly, a light-emitting device having favorable color purity and high light-extraction efficiency can be provided. Further, with the structure described in this embodiment, a transparent conductive layer does not need to be formed in a light-emitting element from which light with the longest wavelength is extracted; accordingly, the number of steps and the cost can be reduced.

The structure described in this embodiment can be combined as appropriate with any of the structures described in the other embodiments.

(Embodiment 5)

In this embodiment, examples of a variety of electronic appliances that are completed using a light-emitting device according to one embodiment of the present invention will be described with reference to FIGS. 5A to 5D.

Examples of the electronic appliances to which the light-emitting device is applied are a television device (also referred to as television or television receiver), a monitor of a computer or the like, a cameras such as a digital camera or a digital video camera, a digital photo frame, a mobile phone (also referred to as cellular phone or cellular phone device), a portable game machine, a portable information terminal, an audio reproducing device, and a large-sized game machine such as a pachinko machine. Specific examples of these electronic appliances are illustrated in FIGS. 5A to 5D.

FIG. 5A illustrates an example of a television set. In a television set 7100, a display portion 7103 is incorporated in a housing 7101. Images can be displayed on the display portion 7103, and the light-emitting device can be used for the display portion 7103. In addition, here, the housing 7101 is supported by a stand 7105.

The television set 7100 can be operated by an operation switch of the housing 7101 or a separate remote controller 7110. With operation keys 7109 of the remote controller 7110, channels and volume can be controlled and images displayed on the display portion 7103 can be controlled. Furthelluore, the remote controller 7110 may be provided with a display portion 7107 for displaying data output from the remote controller 7110.

Note that the television set 7100 is provided with a receiver, a modem, and the like. With the receiver, a general television broadcast can be received. Furthermore, when the television set 7100 is connected to a communication network by wired or wireless connection via the modem, one-way (from a transmitter to a receiver) or two-way (between a transmitter and a receiver, between receivers, or the like) data communication can be performed.

FIG. 5B illustrates a computer having a main body 7201, a housing 7202, a display portion 7203, a keyboard 7204, an external connection port 7205, a pointing device 7206, and the like. Note that this computer is manufactured using the light-emitting device for the display portion 7203.

FIG. 5C illustrates a portable game machine having two housings, a housing 7301 and a housing 7302, which are connected with a joint portion 7303 so that the portable game machine can be opened or folded. A display portion 7304 is incorporated in the housing 7301, and a display portion 7305 is incorporated in the housing 7302. In addition, the portable game machine illustrated in FIG. 5C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), and a microphone 7312), and the like. Needless to say, the structure of the portable game machine is not limited to the above as long as the light-emitting device is used for at least one of the display portion 7304 and the display portion 7305, and may include other accessories as appropriate. The portable game machine illustrated in FIG. 5C has a function of reading out a program or data stored in a storage medium to display it on the display portion, and a function of sharing information with another portable game machine by wireless communication. The portable game machine illustrated in FIG. 5C can have a variety of functions without limitation to the above.

FIG. 5D illustrates an example of a mobile phone. A mobile phone 7400 is provided with a display portion 7402 incorporated in a housing 7401, operation buttons 7403, an external connection port 7404, a speaker 7405, a microphone 7406, and the like. Note that the mobile phone 7400 is manufactured using the light-emitting device for the display portion 7402.

When the display portion 7402 of the mobile phone 7400 illustrated in FIG. 5D is touched with a finger or the like, data can be input to the mobile phone 7400. Further, operations such as making a call and composing an e-mail can be performed by touching the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically switched by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. The screen modes can also be switched depending on the kind of image displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken when the display portion 7402 is touched with the palm or the finger, whereby personal authentication can be performed. Further, by providing a backlight or a sensing light source which emits near-infrared light in the display portion, an image of a finger vein, a palm vein, or the like can be taken.

As described above, the electronic appliances can be obtained by application of the light-emitting device according to one embodiment of the present invention. The light-emitting device has a remarkably wide application range, and can be applied to electronic appliances in a variety of fields.

Note that the structure described in this embodiment can be combined as appropriate with any of the structures described in the other embodiments.

(Embodiment 6)

In this embodiment, examples of a lighting device to which a light-emitting device according to one embodiment of the present invention is applied will be described with reference to FIG. 6.

Figure 6:
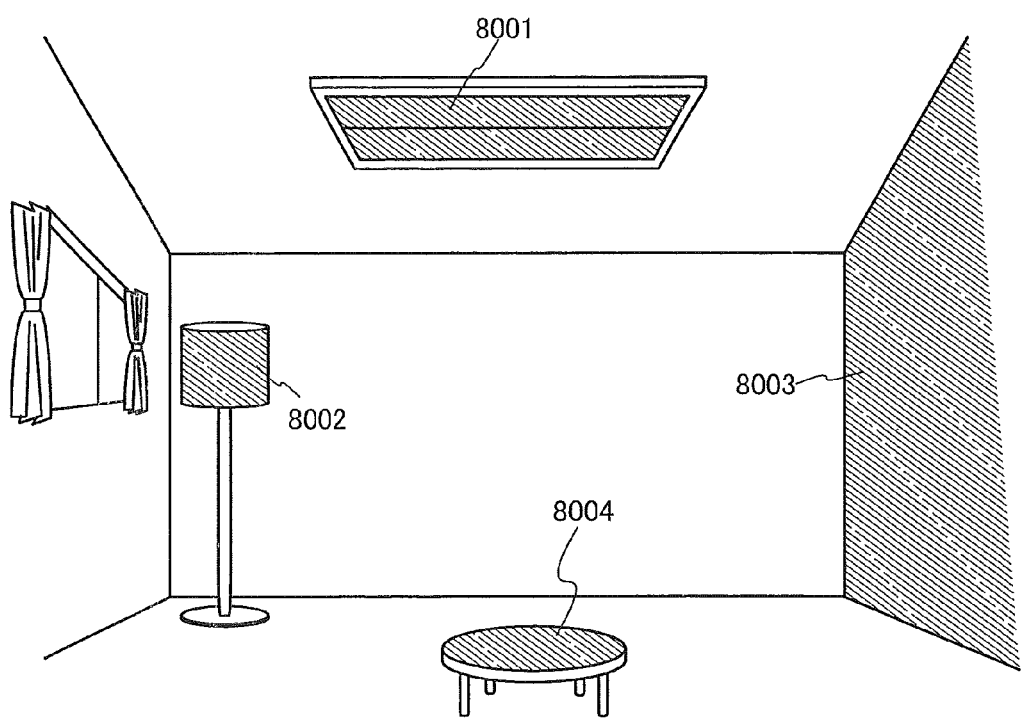
FIG. 6 illustrates lighting devices.

FIG. 6 illustrates an example in which the light-emitting device according to one embodiment of the present invention is used as an indoor lighting device 8001. Since the light-emitting device can have a larger area, it can be used for a lighting device having a large area. In addition, a lighting device 8002 in which a light-emitting region has a curved surface can also be obtained with the use of a housing with a curved surface. A light-emitting element included in the light-emitting device described in this embodiment is in a thin film form, which allows the housing to be designed more freely. Therefore, the lighting device can be elaborately designed in a variety of ways. Further, a wall of the room may be provided with a large-sized lighting device 8003.

Moreover, the light-emitting device according to one embodiment of the present invention can be used for a table by being used as a surface of a table 8004. By being used as part of other furniture, the light-emitting device can be used as the furniture.

As described above, the light-emitting device according to one embodiment of the present invention can be used for various applications. Note that in the light-emitting device according to one embodiment of the present invention, light with wavelengths which differ among light-emitting elements including the same EL layer can be efficiently extracted. Accordingly, a light-emitting device having favorable color purity and high light-extraction efficiency can be provided. Further, a transparent conductive layer does not need to be formed in a light-emitting element from which light with the longest wavelength is extracted; accordingly, the number of steps and the cost can be reduced.

Note that the structure described in this embodiment can be combined as appropriate with any of the structures described in the other embodiments.

[Example]

In this example, a light-emitting device (1) was fabricated such that the total thickness (optical path length) from a reflective electrode 702 to a semi-transmissive and semi-reflective electrode 706 was $\lambda_R$ in a light-emitting element from which light ($\lambda_R$) having a peak in a wavelength range from 600 nm to 760 nm was emitted. Further, a light-emitting device (2) was fabricated such that the total thickness (optical path length) from the reflective electrode 302 to the semi-transmissive and semi-reflective electrode 306 was $\lambda_R/2$ in a light-emitting element from which the light ($\lambda_R$) was emitted as in the above embodiment. Results of measurement of emission spectra in the light-emitting devices will be shown.

Figure 7:
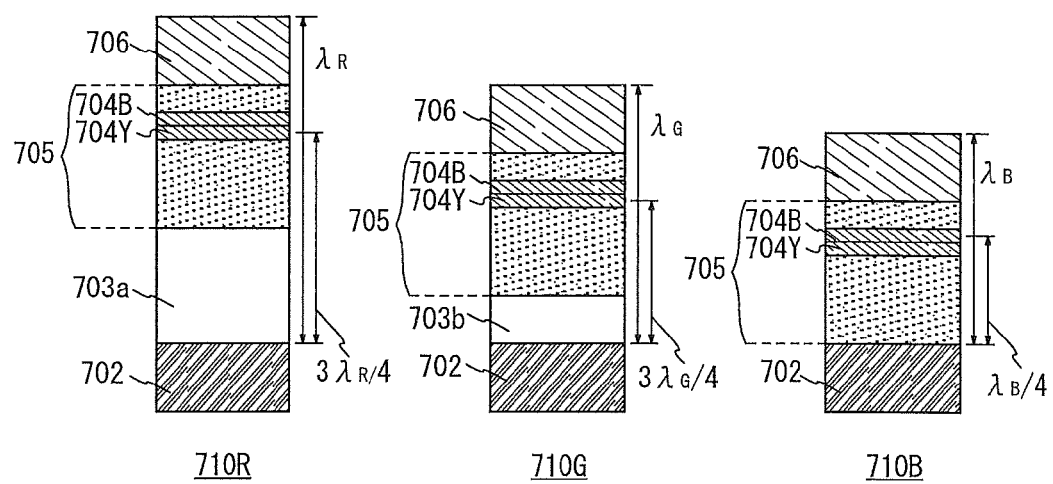
FIG. 7 illustrates a light-emitting device according to one embodiment of the present invention.

The light-emitting device (1) in this example has a structure illustrated in FIG. 7, and includes different light-emitting elements (a first' light-emitting element (R) 710R, a second' light-emitting element (G) 710G, and a third' light-emitting element (B) 710B).

The first' light-emitting element (R) 710R has a structure in which a first transparent conductive layer 703a; an EL layer 705 including a first light-emitting layer (Y) 704Y and a second light-emitting layer (B) 704B in part; and the semi-transmissive and semi-reflective electrode 706 are sequentially stacked over the reflective electrode 702. The second' light-emitting element (G) 710G has a structure in which a second transparent conductive layer 703b, the EL layer 705, and the semi-transmissive and semi-reflective electrode 706 are sequentially stacked over the reflective electrode 702. The third' light-emitting element (B) 710B has a structure in which the EL layer 705 and the semi-transmissive and semi-reflective electrode 706 are sequentially stacked over the reflective electrode 702.

The reflective electrode 702, the EL layer 705, and the semi-transmissive and semi-reflective electrode 706 are common to the light-emitting elements (the first' light-emitting element (R) 710R, the second' light-emitting element (G) 710G, and the third' light-emitting element (B) 710B). The first light-emitting layer (Y) 704Y emits light ($\lambda_Y$) having a peak in a wavelength range from 550 nm to 570 nm. The second light-emitting layer (B) 704B emits light ($\lambda_B$) having a peak in a wavelength range from 420 nm to 480 nm Thus, in each of the light-emitting elements (the first' light-emitting element (R) 710R, the second' light-emitting element (G) 710G, and the third' light-emitting element (B) 710B), light emitted from the first light-emitting layer (Y) 704Y and light emitted from the second light-emitting layer (B) 704B overlap with each other; accordingly, light having a broad emission spectrum that covers a visible light range can be emitted. Note that the above wavelengths satisfy the relation of $\lambda_B < \lambda_Y$.

In the light-emitting device (1), the total thickness (optical path length) from the reflective electrode 702 to the semi-transmissive and semi-reflective electrode 706 is set to $\lambda_R$ in the first' light-emitting element (R) 710R; the total thickness (optical path length) from the reflective electrode 702 to the semi-transmissive and semi-reflective electrode 706 is set to $\lambda_G$ in the second' light-emitting element (G) 710G; and the total thickness (optical path length) from the reflective electrode 702 to the semi-transmissive and semi-reflective electrode 706 is set to $\lambda_B$ in the third' light-emitting element (B) 710B. Note that the first' light-emitting element (R) 710R is a light-emitting element from which light with $\lambda_R$ is mainly emitted; the second' light-emitting element (G) 710G is a light-emitting element from which light with $\lambda_G$ is mainly emitted; and the third' light-emitting element (B) 710B is a light-emitting element from which light with $\lambda_B$ is mainly emitted.

In addition, in the light-emitting device (1), the total thickness (optical path length) from the reflective electrode 702 to the first light-emitting layer (Y) 704Y is set to $3\lambda_R/4$ in the first' light-emitting element (R) 710R; the total thickness (optical path length) from the reflective electrode 702 to the first light-emitting layer (Y) 704Y is set to $3\lambda_G/4$ in the second' light-emitting element (G) 710G; and the total thickness (optical path length) from the reflective electrode 702 to the second light-emitting layer (B) 704B is set to $\lambda_R/4$ in the third' light-emitting element (B) 710B.

The light-emitting device (2) in this example has the structure illustrated in FIG. 3 in Embodiment 3, and includes different light-emitting elements (the first light-emitting element (G) 310G, the second light-emitting element (B) 310B, and the third light-emitting element (R) 310R).

In the light-emitting device (2), the first light-emitting element (G) 310G has a structure in which the first transparent conductive layer 303a; the EL layer 305 including the first light-emitting layer (Y) 304Y and the second light-emitting layer (B) 304B in part; and the semi-transmissive and semi-reflective electrode 306 are sequentially stacked over the reflective electrode 302. The second light-emitting element (B) 310B has a structure in which the second transparent conductive layer 303b, the EL layer 305, and the semi-transmissive and semi-reflective electrode 306 are sequentially stacked over the reflective electrode 302. The third light-emitting element (R) 310R has a structure in which the EL layer 305 and the semi-transmissive and semi-reflective electrode 306 are sequentially stacked over the reflective electrode 302.

The reflective electrode 302, the EL layer 305, and the semi-transmissive and semi-reflective electrode 306 are common to the light-emitting elements (the first light-emitting element (G) 310G, the second light-emitting element (B) 310B, and the third light-emitting element (R) 310R). The first light-emitting layer (Y) 304Y emits light ($\lambda_Y$) having a peak in a wavelength range from 550 nm to 570 nm. The second light-emitting layer (B) 304B emits light ($\lambda_B$) having a peak in a wavelength range from 420 nm to 480 nm.

In the light-emitting device (2), the total thickness (optical path length) from the reflective electrode 302 to the semi-transmissive and semi-reflective electrode 306 is set to $\lambda_G$ in the first light-emitting element (G) 310G; the total thickness (optical path length) from the reflective electrode 302 to the semi-transmissive and semi-reflective electrode 306 is set to $\lambda_B$ in the second light-emitting element (B) 310B; and the total thickness (optical path length) from the reflective electrode 302 to the semi-transmissive and semi-reflective electrode 306 is set to $\lambda_R/2$ in the third light-emitting element (R) 310R. Note that the first light-emitting element (G) 310G is a light-emitting element from which light with $\lambda_G$ is mainly emitted; the second light-emitting element (B) 310B is a light-emitting element from which light with $\lambda_B$ is mainly emitted; and the third light-emitting element (R) 310R is a light-emitting element from which light with $\lambda_R$ is mainly emitted.

In addition, in the light-emitting device (2), the total thickness (optical path length) from the reflective electrode 302 to the first light-emitting layer (Y) 304Y is set to $3\lambda_G/4$ in the first light-emitting element (G) 310G; the total thickness (optical path length) from the reflective electrode 302 to the second light-emitting layer (B) 304B is set to $3\lambda_R/4$ in the second light-emitting element (B) 310B; and the total thickness (optical path length) from the reflective electrode 302 to the first light-emitting layer (Y) 304Y is set to $\lambda_R/4$ in the third light-emitting element (R) 310R.

Specific methods of manufacturing the light-emitting device (1) and the light-emitting device (2) will be described below. Note that the following description is common to the light-emitting device (1) and the light-emitting device (2) unless otherwise stated, and different portions will be pointed out as appropriate.

First, a layered film including a titanium-aluminum (Ti—Al) alloy film and a titanium oxide ($TiO_2$) film was formed over a glass substrate by a sputtering method, so that the reflective electrode 702 (302) was formed. Note that the thickness of the reflective electrode 702 (302) was 110 nm. In this example, the reflective electrode 702 (302) was formed as an anode.

Next, a transparent conductive layer was formed. In each of the light-emitting device (1) and the light-emitting device (2), the first transparent conductive layer (703a or 303a) and the second transparent conductive layer (703b or 303b) were formed using indium tin oxide containing silicon oxide (ITSO) by a sputtering method. The thicknesses of the layers are shown below.

In the light-emitting device (1), the first transparent conductive layer 703a of the first' light-emitting element (R) 710R was formed to a thickness of 90 nm, and the second transparent conductive layer 703b of the second' light-emitting element (G) 710G was formed to a thickness of 45 nm. A transparent conductive layer was not formed in the third' light-emitting element (B) 710B. In the light-emitting device (2), the first transparent conductive layer 303a of the first light-emitting element (G) 310G was formed to a thickness of 90 nm, and the second transparent conductive layer 303b of the second light-emitting element (B) 310B was formed to a thickness of 45 nm. A transparent conductive layer was not formed in the third light-emitting element (R) 310R. In the light-emitting device (1), the first' light-emitting element (R) 710R exhibits red light, the second' light-emitting element (G) 710G exhibits green light, and the third' light-emitting element (B) 710B exhibits blue light. In the light-emitting device (2), the first light-emitting element (G) 310G exhibits green light, the second light-emitting element (B) 310B exhibits blue light, and the third light-emitting element (R) 310R exhibits red light.

Next, the EL layer 705 (305) including a stack of a plurality of layers was formed over the reflective electrode 702 (302). In this example, the EL layer 705 (305) has a structure in which a hole-injection layer, a hole-transport layer, the first light-emitting layer (Y) 704Y (304Y) serving as a light-emitting layer, the second light-emitting layer (B) 704B (304B) serving as a light-emitting layer, an electron-transport layer, and an electron-injection layer are sequentially stacked.

The substrate provided with the reflective electrode 702 (302) was fixed to a substrate holder which was provided in a vacuum evaporation apparatus so that a surface provided with the reflective electrode 702 (302) faced downward. The pressure in the vacuum evaporation apparatus was reduced to approximately $10^{-4}$ Pa. Then, on the reflective electrode 702 (302), 4,4'-bis[N-(1-naphthyl)-N-phenylamino]biphenyl (abbreviation: NPB or α-NPD) and molybdenum(VI) oxide were co-evaporated to form a hole-injection layer. The thicknesses of the hole-injection layers were 120 nm and 50 nm in the light-emitting device (1) and the light-emitting device (2), respectively. The evaporation rate was adjusted such that the weight ratio of NPB to molybdenum oxide was 2:0.222 (=NPB:molybdenum oxide). Note that a co-evaporation method refers to an evaporation method in which evaporation is carried out from a plurality of evaporation sources at the same time in one treatment chamber.

Next, a hole-transport material was deposited on the hole-injection layer to a thickness of 10 nm by an evaporation method using resistance heating to form a hole-transport layer. Note that NPB (abbreviation) was used for the hole-transport layer.

Next, the first light-emitting layer (Y) 704Y (304Y) serving as a light-emitting layer was formed over the hole-transport layer by an evaporation method using resistance heating. In the formation of the first light-emitting layer (Y) 704Y (304Y), a film was formed to a thickness of 20 nm by co-evaporation using 9-phenyl-9'-[4-10-phenyl-9-anthryl)phenyl]-3,3'-bi(9H-carbazole) (abbreviation: PCCPA) as a host material and rubrene as a guest material. Note that the evaporation rate was adjusted such that the weight ratio of PCCPA (abbreviation) to rubrene was 1:0.01 (=PCCPA (abbreviation):rubrene).

Further, the second light-emitting layer (B) 704B (304B) was formed over the first light-emitting layer (Y) 704Y (304Y). In the formation of the second light-emitting layer (B) 704B (304B), a film was formed to a thickness of 30 nm by co-evaporation using 9-[4-(N-carbazolyl)]phenyl-10-phenylanthracene (abbreviation: CzPA) as a host material and 4-(10-phenyl-9-anthryl)-4'-(9-phenyl-9H-carbazol-3-yl)triphenylamine (abbreviation: PCBAPA) as a guest material. Note that the evaporation rate was adjusted such that the weight ratio of CzPA (abbreviation) to PCBAPA (abbreviation) was 1:0.1 (=CzPA (abbreviation):PCBAPA (abbreviation)).

Furthermore, over the second light-emitting layer (B) 704B (304B), a 10-nm-thick film of tris(8-quinolinolato)aluminum(III) (abbreviation: Alq) and, thereover, a 20-nm-thick film of bathophenanthroline (abbreviation: BPhen) in a case of the light-emitting device (1) and a 10-nm-thick film of bathophenanthroline (abbreviation: BPhen) in a case of the light-emitting device (2) were formed by an evaporation method using resistance heating to form an electron-transport layer.

Then, a lithium fluoride (LiF) film was formed to a thickness of 1 nm over the electron-transport layer to form an electron-injection layer.

Finally, a magnesium-silver alloy (Mg—Ag alloy, Mg:Ag=0.05:0.5) film was formed by an evaporation method using resistance heating. The thicknesses of the magnesium-silver alloy films were 10 nm and 15 nm in the light-emitting device (1) and the light-emitting device (2), respectively. Further, a film of indium tin oxide containing silicon oxide (ITSO) was formed. The thicknesses of the films of indium tin oxide containing silicon oxide were 50 nm and 90 nm in the light-emitting device (1) and the light-emitting device (2), respectively. As the semi-transmissive and semi-reflective electrode 706 (306), the layered film including the magnesium-silver alloy film and the film of indium tin oxide containing silicon oxide was used. In this manner, the light-emitting device (1) and the light-emitting device (2) were fabricated.

Table 1 shows the element structures of the light-emitting device (1) and the light-emitting device (2) obtained in the above manner.

TABLE 1

| Light-emitting element | Reflective electrode | | | Transparent conductive layer | Hole-injection layer | Hole-transport layer | EL layer First light-emitting layer (Y) | Second light-emitting layer (B) | Electron-transport layer | | Electron-injection layer | semi-transmissive and semi-reflective electrode | |
|---|---|---|---|---|---|---|---|---|---|---|---|---|---|
| Light emitting device (1)* | 1' | Ti 50 nm | Al 200 nm | TD$_2$ 3 nm | ITSO 90 nm (1') | NPB MoOx (20.222) 120 nm | NPB 10 nm | PCCPA Rubrene (10.01) 20 nm | CzPA PCBAPA (10.1) 30 nm | Alq 10 nm | BPhen 20 nm | LF 1 nm | Mg:Ag (0.05:0.5) 10 nm | ITSO 50 nm |
| | 2' | | | | ITSO 45 nm (2') | | | | | | | | | |
| | 3' | | | | — | | | | | | | | | |

TABLE 1-continued

| | Light-emitting element | Reflective electrode | | | Transparent conductive layer | EL layer | | | | | | | semi-transmissive and semi-reflective electrode |
|---|---|---|---|---|---|---|---|---|---|---|---|---|---|
| | | | | | | Hole-injection layer | Hole-transport layer | First light-emitting layer (Y) | Second light-emitting layer (B) | Electron-transport layer | Electron-injection layer | | |
| Reference numeral | — | 702 | | | 703a (1')<br>703b (2') | — | — | 704Y | 704B | | | | 706 |
| Light emitting device (2)** | 1<br>2<br>3 | Ti<br>50 nm | Al<br>200 nm | TD$_2$<br>3 nm | ITSO<br>90 nm (1')<br>ITSO<br>45 nm (2')<br>— | NPB MoOx<br>(20.222)<br>50 nm | NPB<br>10 nm | 705<br>PCCPA<br>Rubrene<br>(10.01)<br>20 nm | CzPA<br>PCBAPA<br>(10.1)<br>30 nm | Alq<br>10 nm | BPhen<br>10 nm | LF<br>1 nm | Mg:Ag ITSO<br>(0.05:0.5) 90 nm<br>15 nm |
| Reference numeral | — | 302 | | | 303a (1')<br>303b (2') | — | — | 304Y | 305<br>304B | — | — | | 306 |

*The case where the optical path lengths from the reflective electrode to the semi-transmissive and semi-reflective electrode are $\lambda_R$ and $\lambda_B$ in the light-emitting element (R) exhibiting light with $\lambda_R$ and the light-emitting element (B) exhibiting light with $\lambda_B$, respectively.
**The case where the optical path lengths from the reflective electrode to the semi-transmissive and semi-reflective electrode are $\lambda_R/2$ and $\lambda_B$ in the light-emitting element (R) exhibiting light with $\lambda_R$ and the light-emitting element (B) exhibiting light with $\lambda_B$, respectively.
Note that in this table, the first to third light-emitting elements are denoted by light-emitting elements 1 to 3, respectively; the first' to third' light-emitting elements are denoted by light-emitting elements 1' to 3', respectively.

Figure 8A:
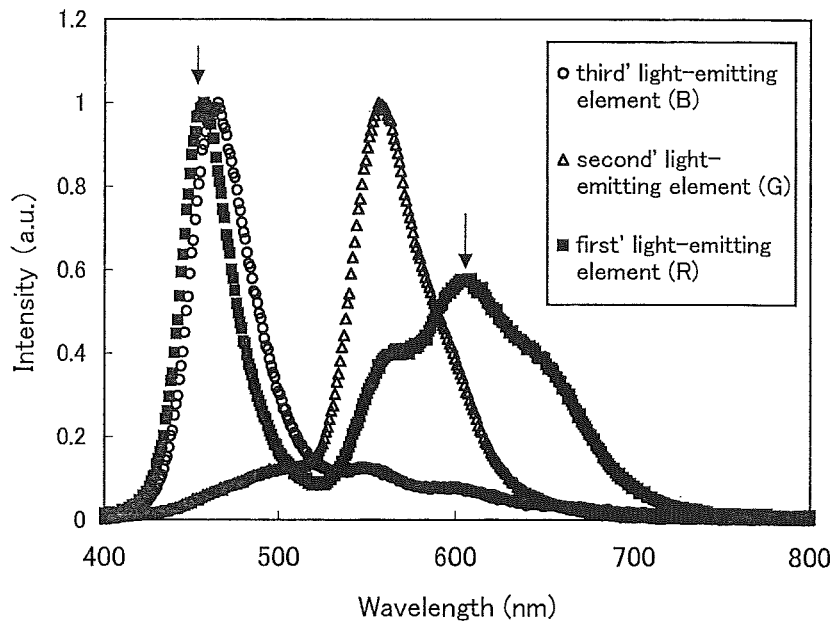
FIGS. 8A and 8B show results of measurement of emission spectra.
Figure 8B:
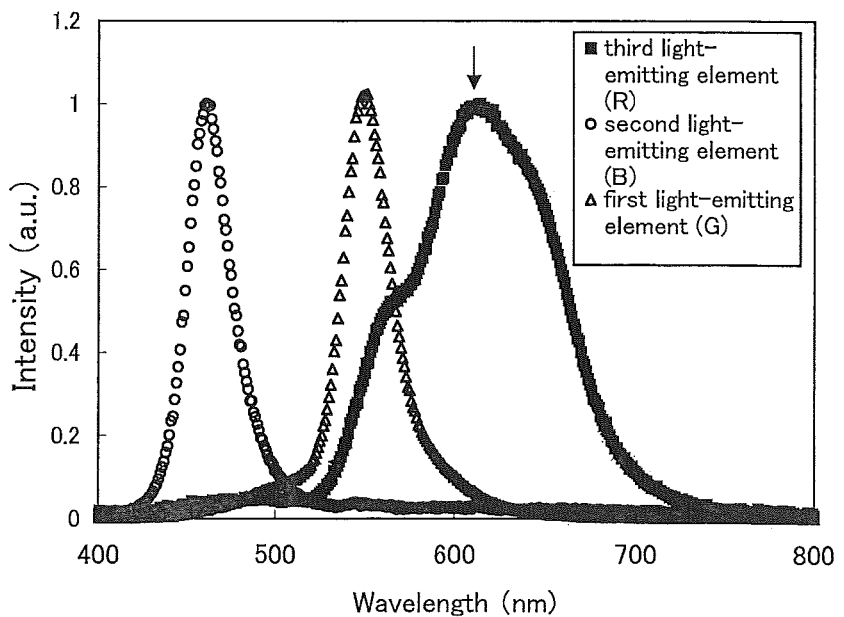

FIGS. 8A and 8B show results of measurement of emission spectra in the light-emitting device (1) and the light-emitting device (2), respectively, which were fabricated in this example.

As is obvious from the results of the spectrum measurement, in the light-emitting device (1) including the first' light-emitting element (R) 710R in which the total thickness (optical path length) from the reflective electrode 702 to the semi-transmissive and semi-reflective electrode 706 was set to $\lambda_R$, the emission spectrum of the first' light-emitting element (R) 710R has two kinds of peak in the vicinity of 460 nm and the in the vicinity of 610 nm. In contrast, in the light-emitting device (2) including the third light-emitting element (R) 310R in which the total thickness (optical path length) from the reflective electrode 302 to the semi-transmissive and semi-reflective electrode 306 was set to $\lambda_R/2$, the emission spectrum of the third light-emitting element (R) 310R has only one kind of peak in the vicinity of 610 nm.

Thus, the results indicate that, by setting the total thickness (optical path length) from a reflective electrode to a semi-transmissive and semi-reflective electrode to $\lambda_R/2$ in a light-emitting element from which light with $\lambda_R$ is mainly emitted, light with different emission spectrum peaks can be prevented from being emitted from one light-emitting element.

This application is based on Japanese Patent Application serial no. 2011-085922 filed with the Japan Patent Office on Apr. 8, 2011, the entire contents of which are hereby incorporated by reference.

What is claimed is:

1. A light-emitting device comprising:
   a first light-emitting element including a first reflective electrode, a first transparent conductive layer in contact with the first reflective electrode, an EL layer in contact with the first transparent conductive layer, and a semi-transmissive and semi-reflective electrode in contact with the EL layer;
   a second light-emitting element including a second reflective electrode, a second transparent conductive layer in contact with the second reflective electrode, the EL layer in contact with the second transparent conductive layer, and the semi-transmissive and semi-reflective electrode in contact with the EL layer; and
   a third light-emitting element including a third reflective electrode, the EL layer in contact with the third reflective electrode, and the semi-transmissive and semi-reflective electrode in contact with the EL layer,
   wherein the EL layer includes a light-emitting layer emitting light with a wavelength $\lambda R$,
   wherein the light with the wavelength $\lambda R$ is emitted from the third light-emitting element, and
   wherein, in the third light-emitting element, an optical path length from the third reflective electrode to the light-emitting layer is $\lambda R/4$ and an optical path length from the third reflective electrode to the semi-transmissive and semi-reflective electrode is $\lambda R/2$.

2. The light-emitting device according to claim 1,
   wherein the EL layer includes one or more of a hole-injection layer, a hole-transport layer, an electron-transport layer, and an electron-injection layer.

3. The light-emitting device according to claim 1,
   wherein the first transparent conductive layer is thicker than the second transparent conductive layer.

4. The light-emitting device according to claim 1,
   wherein light emitted from the first light-emitting element, light emitted from the second light-emitting element, and light emitted from the third light-emitting element have wavelengths different from each other.

5. The light-emitting device according to claim 1,
   wherein the first, second and third reflective electrodes are formed using a same material.

6. An electronic appliance comprising the light-emitting device according to claim 1.

7. A lighting device comprising the light-emitting device according to claim 1.

8. A light-emitting device comprising:
   a first light-emitting element including a first reflective electrode, a first transparent conductive layer in contact with the first reflective electrode, an EL layer in contact with the first transparent conductive layer, and a semi-transmissive and semi-reflective electrode in contact with the EL layer;
   a second light-emitting element including a second reflective electrode, a second transparent conductive layer in contact with the second reflective electrode, the EL layer in contact with the second transparent conductive layer, and the semi-transmissive and semi-reflective electrode in contact with the EL layer; and
   a third light-emitting element including a third reflective electrode, the EL layer in contact with the third reflective electrode, and the semi-transmissive and semi-reflective electrode in contact with the EL layer, wherein the EL layer includes a first light-emitting layer emitting light with a wavelength λR, a second light-emitting layer emitting light with a wavelength λG, and a third light-emitting layer emitting light with a wavelength λB, where a wavelength relation of λR>λG>λB is satisfied, wherein the light with the wavelength λG is emitted from the first light-emitting element, wherein, in the first light-emitting element, an optical path length from the first reflective electrode to the second light-emitting layer is 3λG/4 and an optical path length from the first reflective electrode to the semi-transmissive and semi-reflective electrode is λG, wherein the light with the wavelength λB is emitted from the second light-emitting element, wherein, in the second light-emitting element, an optical path length from the second reflective electrode to the third light-emitting layer is 3λB/4 and an optical path length from the second reflective electrode to the semi-transmissive and semi-reflective electrode is λB, wherein the light with the wavelength λR is emitted from the third light-emitting element, and wherein, in the third light-emitting element, an optical path length from the third reflective electrode to the first light-emitting layer is λR/4 and an optical path length from the third reflective electrode to the semi-transmissive and semi-reflective electrode is λR/2.

9. The light-emitting device according to claim 8,
wherein the EL layer includes one or more of a hole-injection layer, a hole-transport layer, an electron-transport layer, and an electron-injection layer.

10. The light-emitting device according to claim 8,
wherein the first transparent conductive layer is thicker than the second transparent conductive layer.

11. The light-emitting device according to claim 8,
wherein light emitted from the first light-emitting element, light emitted from the second light-emitting element, and light emitted from the third light-emitting element have wavelengths different from each other.

12. The light-emitting device according to claim 8,
wherein the first, second and third reflective electrodes are formed using a same material.

13. An electronic appliance comprising the light-emitting device according to claim 8.

14. A lighting device comprising the light-emitting device according to claim 8.

15. A light-emitting device comprising:
a first light-emitting element including a first reflective electrode, a first transparent conductive layer in contact with the first reflective electrode, an EL layer in contact with the first transparent conductive layer, and a semi-transmissive and semi-reflective electrode in contact with the EL layer; and
a second light-emitting element including a second reflective electrode, the EL layer in contact with the second reflective electrode, and the semi-transmissive and semi-reflective electrode in contact with the EL layer,
wherein the EL layer includes a light-emitting layer emitting light with a wavelength λR,
wherein the light with the wavelength λR is emitted from the second light-emitting element, and
wherein, in the second light-emitting element, an optical path length from the second reflective electrode to the light-emitting layer is λR/4 and an optical path length from the second reflective electrode to the semi-transmissive and semi-reflective electrode is λR/2.

16. The light-emitting device according to claim 15,
wherein the EL layer includes one or more of a hole-injection layer, a hole-transport layer, an electron-transport layer, and an electron-injection layer.

17. The light-emitting device according to claim 15,
wherein light emitted from the first light-emitting element and light emitted from the second light-emitting element have wavelengths different from each other.

18. The light-emitting device according to claim 15,
wherein the first and second reflective electrodes are formed using a same material.

19. An electronic appliance comprising the light-emitting device according to claim 15.

20. A lighting device comprising the light-emitting device according to claim 15.

21. A light-emitting device comprising:
a first light-emitting element including a first reflective electrode, a first transparent conductive layer in contact with the first reflective electrode, an EL layer in contact with the first transparent conductive layer, and a semi-transmissive and semi-reflective electrode in contact with the EL layer;
a second light-emitting element including a second reflective electrode, a second transparent conductive layer in contact with the second reflective electrode, the EL layer in contact with the second transparent conductive layer, and the semi-transmissive and semi-reflective electrode in contact with the EL layer; and
a third light-emitting element including a third reflective electrode, the EL layer in contact with the third reflective electrode, and the semi-transmissive and semi-reflective electrode in contact with the EL layer,
wherein the light with the wavelength λ1 is emitted from the first light-emitting element
wherein the light with the wavelength λ2 is emitted from the second light-emitting element
wherein the light with the wavelength λ3 is emitted from the third light-emitting element,
wherein a wavelength relation of λ3>λ1>λ2 is satisfied,
wherein an optical path length from the first reflective electrode to the semi-transmissive and semi-reflective electrode in the first light-emitting element is longer than an optical path length from the third reflective electrode to the semi-transmissive and semi-reflective electrode in the third light-emitting element, and
wherein an optical path length from the second reflective electrode to the semi-transmissive and semi-reflective electrode in the second light-emitting element is longer than the optical path length from the third reflective electrode to the semi-transmissive and semi-reflective electrode in the third light-emitting element.

22. The light-emitting device according to claim 21,
wherein the EL layer includes one or more of a hole-injection layer, a hole-transport layer, an electron-transport layer, and an electron-injection layer.

23. The light-emitting device according to claim 21,
wherein the first transparent conductive layer is thicker than the second transparent conductive layer.

24. The light-emitting device according to claim 21,
wherein the first, second and third reflective electrodes are formed using a same material.

25. An electronic appliance comprising the light-emitting device according to claim 21.

26. A lighting device comprising the light-emitting device according to claim 21.

\* \* \* \* \*